(12) United States Patent
Yanagisawa

(10) Patent No.: US 7,834,645 B2
(45) Date of Patent: Nov. 16, 2010

(54) VARIABLE CAPACITANCE CIRCUIT, VOLTAGE MEASURING APPARATUS, AND POWER MEASURING APPARATUS

(75) Inventor: Koichi Yanagisawa, Nagano (JP)

(73) Assignee: Hioki Denki Kabushiki Kaisha, Nagano (JP)

( * ) Notice: Subject to any disclaimer, the term of this patent is extended or adjusted under 35 U.S.C. 154(b) by 1005 days.

(21) Appl. No.: 11/611,333

(22) Filed: Dec. 15, 2006

(65) Prior Publication Data

US 2007/0164723 A1 Jul. 19, 2007

(30) Foreign Application Priority Data

Dec. 20, 2005 (JP) .............................. 2005-365666
Aug. 29, 2006 (JP) .............................. 2006-231491

(51) Int. Cl.
*G01R 27/26* (2006.01)

(52) U.S. Cl. .................. 324/673; 324/457; 324/660; 324/661; 324/672; 324/679; 324/680; 324/686; 324/690

(58) Field of Classification Search .................. 324/457, 324/658, 660, 661, 672, 673, 679, 680, 686, 324/690
See application file for complete search history.

(56) References Cited

U.S. PATENT DOCUMENTS

| | | | | |
|---|---|---|---|---|
| 3,115,603 | A * | 12/1963 | Fluegel | 324/680 |
| 3,414,721 | A * | 12/1968 | Oliver | 708/843 |
| 3,757,211 | A * | 9/1973 | Goto | 324/671 |
| 4,489,278 | A * | 12/1984 | Sawazaki | 324/457 |
| 4,617,908 | A * | 10/1986 | Miller et al. | 126/20 |
| 6,407,557 | B1 * | 6/2002 | Coudray et al. | 324/708 |
| 7,466,145 | B2 * | 12/2008 | Yanagisawa | 324/658 |
| 2007/0108992 | A1 * | 5/2007 | Yanagisawa | 324/658 |

FOREIGN PATENT DOCUMENTS

| | | |
|---|---|---|
| JP | 4-305171 | 10/1992 |
| JP | 6-242166 | 9/1994 |
| JP | 6-308179 | 11/1994 |
| JP | 7-244103 | 9/1995 |

(Continued)

OTHER PUBLICATIONS

English Language Abstract of JP 4-305171, 1992.

(Continued)

*Primary Examiner*—Patrick J Assouad
*Assistant Examiner*—Manuel Hernandez
(74) *Attorney, Agent, or Firm*—Greenblum & Bernstein, P.L.C.

(57) ABSTRACT

A variable capacitance circuit includes a capacitance changing structure constructed by connecting a first construction unit, a second construction unit, a third construction unit, and a fourth construction unit, which each include a first electric element that hinders transmission of a direct current (DC) signal and has a capacitance that changes in accordance with the magnitude of an absolute value of an applied voltage, in the mentioned order in a ring. A voltage measuring apparatus measures the voltage of a measured object and includes a detection electrode capable of being disposed facing the measured object and the variable capacitance circuit described above. A power measuring apparatus includes a current measuring apparatus that measures current flowing in a measured object and the voltage measuring apparatus that measures the voltage of the measured object.

25 Claims, 13 Drawing Sheets

FOREIGN PATENT DOCUMENTS

| | | |
|---|---|---|
| JP | 8-181038 | 7/1996 |
| JP | 8-271562 | 10/1996 |
| JP | 9-153436 | 6/1997 |

OTHER PUBLICATIONS

English Language Abstract of JP 6-242166, 1994.
English Language Abstract of JP 6-308179, 1994.
English Language Abstract of JP 7-244103, 1995.
English Language Abstract of JP 8-181038, 1996.
English Language Abstract of JP 8-271562, 1996.
English Language Abstract of JP 9-153436, 1997.
U.S. Appl. No. 11/539,891 to Yanagisawa, filed Oct. 10, 2006.

* cited by examiner

VARIABLE CAPACITANCE CIRCUIT, VOLTAGE MEASURING APPARATUS, AND POWER MEASURING APPARATUS

BACKGROUND OF THE INVENTION

1. Field of the Invention

The present invention relates to a variable capacitance circuit whose electrostatic capacitance can be changed at high speed, a voltage measuring apparatus that is equipped with such variable capacitance circuit and can measure the voltage of a measured body without contacting the measured body, and a power measuring apparatus that uses such voltage measuring apparatus.

2. Description of the Related Art

A variety of voltage measuring apparatuses are known, such as those disclosed by Japanese Laid-Open Patent Publication Nos. H04-305171 and H07-244103.

Out of such voltage measuring apparatuses, according to the conventional technology disclosed by Japanese Laid-Open Patent Publication No. H04-305171, a voltage measuring apparatus (distance-compensating potentiometer) used to measure the charge density of both surfaces of a measured object (a charged body) includes a probe unit, in which a detection electrode and a vibrating body are incorporated, an oscillator, a preamp, an amplifier, a synchronous detector, an integrator, a high-voltage generator, and an impedance matching circuit. With this voltage measuring apparatus, the detection electrode is vibrated using the vibrating body and disposed facing the measured object. When doing so, since the electrostatic capacitance formed between the detection electrode and the measured object changes and therefore the electric field strength between the measured object and the detection electrode changes, an AC voltage corresponding to the electric field strength between the measured object and the 5 detection electrode is generated at the detection electrode. The high-voltage generator generates a DC voltage corresponding to this AC voltage and feeds the DC voltage back to the probe unit. When doing so, the electric field strength between the measured object and the detection electrode becomes zero when the voltage of the probe unit matches the voltage of the charged body. Accordingly, by detecting the DC voltage fed back from the high-voltage generator to the probe unit when the electric field strength between the measured object and the detection electrode becomes zero, that is, when the AC voltage generated in the detection electrode reaches zero volts, the voltage of the measured body is measured.

On the other hand, with the conventional technology disclosed by Japanese Laid-Open Patent Publication No. H07-244103, in the disclosed voltage measuring apparatus (a distance-compensating surface potentiometer), electric charge that is proportional to the potential of the measured object (the "sample") and is proportional to the electrostatic capacitance between the detection electrode (the "fixed electrode") and the measured object is generated at the surface of the detection electrode by electric flux lines, out of the electric flux lines emitted from the surface of the measured object, which pass through an input hole and reach the detection electrode. A conductive sector is mechanically moved so as to repeatedly shield and then release the electric flux lines that pass through the input hole to reach the detection electrode. By doing so, charge is repeatedly generated at and removed from the detection electrode, a current that is proportional to the rate of change in the charge flows to a load resistance, and an AC voltage is generated across the load resistance. Although the voltage measuring apparatus disclosed by Japanese Laid-Open Patent Publication No. H07-244103 differs to the voltage measuring apparatus disclosed by Japanese Laid-Open Patent Publication No. H04-305171 described above in the construction for generating the AC voltage, the other parts of the construction are fundamentally the same as in the voltage measuring apparatus disclosed by Japanese Laid-Open Patent Publication No. H04-305171. By reducing the potential difference between the probe case (or the equivalent to the case of the probe unit) and the measured object based on the AC voltage generated across the load resistance, the potential of the measured object is measured in the same way as by the voltage measuring apparatus disclosed by Japanese Laid-Open Patent Publication No. H04-305171.

SUMMARY OF THE INVENTION

By investigating the voltage measuring apparatuses described above, the present inventors discovered the following problem. That is, in the voltage measuring apparatus disclosed by Japanese Laid-Open Patent Publication No. H04-305171, the detection electrode is vibrated by the vibrating body. On the other hand, in the voltage measuring apparatus disclosed by Japanese Laid-Open Patent Publication No. H07-244103, the conductive sector is mechanically moved. Accordingly, both voltage measuring apparatuses have a problem in that the presence of a mechanically movable structure makes it difficult to raise the operating frequency and to improve reliability.

The present invention was conceived to solve the problem described above and it is a principal object of the present invention to provide a variable capacitance circuit, a voltage measuring apparatus, and a power measuring apparatus that have a high operating frequency and high reliability.

To achieve the stated object, a first variable capacitance circuit according to the present invention includes a capacitance changing structure constructed by connecting a first construction unit, a second construction unit, a third construction unit, and a fourth construction unit, which each include a first electric element that hinders transmission of a direct current (DC) signal and has a capacitance that changes in accordance with the magnitude of an absolute value of an applied voltage, in the mentioned order in a ring.

A second variable capacitance circuit according to the present invention includes a capacitance changing structure constructed by connecting a first construction unit, a second construction unit, a third construction unit, and a fourth construction unit in the mentioned order in a ring, wherein the construction units in one pair out of a pair of the first construction unit and the fourth construction unit and a pair of the second construction unit and the third construction unit each include a first electric element that hinders transmission of a DC signal and has a capacitance that changes in accordance with the magnitude of an absolute value of an applied voltage and the construction units in the other pair each include a second electric element that permits transmission of an alternating current (AC) signal.

According to the first and second variable capacitance circuits and a third variable capacitance circuit (described later), by constructing a capacitance changing structure by connecting a first construction unit, a second construction unit, a third construction unit, and a fourth construction unit in the mentioned order in a ring, constructing at least two adjacent construction units out of the four construction units so as to respectively include first electric elements that hinder the transmission of a DC signal and have a capacitance that changes according to the magnitude of the absolute value of the applied voltage, and constructing the other two construction units so as to include any of the first electric elements, second electric elements that permit the transmission of an AC signal, and third electric elements that hinder transmission of a DC signal but permit the transmission of an AC signal, compared to a variable capacitance circuit that includes a mechanically movable structure, it is possible to realize a variable capacitance circuit that can carry out capacitance changing operations at a high frequency of several hundred kHz to several MHz (i.e., a variable capacitance circuit whose operating frequency can be increased) and has high reliability. In addition, since at least two adjacent construction units in the variable capacitance circuit include the first electric elements as described above, when a driving AC voltage is applied across a pair of opposing connection points out of the four connection points of the four construction units (i.e., across a pair of non-adjacent connection points), it is possible to change the electrostatic capacitance between the other pair of opposing connection points (i.e., between the other pair of non-adjacent connection points) with a frequency (a "capacitance modulation frequency") that is double the frequency of the AC voltage. As a result, capacitance changing operations can be carried out at higher frequency.

In the second variable capacitance circuit, each second electric element may include at least one of a capacitor, a coil, a resistor, and a resonator.

According to this variable capacitance circuit, by constructing the second electric elements so as to include at least one of a capacitor, a coil, a resistor, and a resonator, it is possible to construct the variable capacitance circuit easily and at low cost. In particular, when the construction units in one pair or the other pair out of a pair of the first construction unit and the fourth construction unit and a pair of the second construction unit and the third construction unit respectively include resonators, and more specifically resonators where the impedance is minimized at a frequency (the capacitance modulation frequency) that is double the frequency of the driving AC voltage applied between the connection point of the first construction unit and the second construction unit and the connection point of the third construction unit and the fourth construction unit, and the impedance is sufficiently high at other frequencies, the impedances of the resonators will fall at the capacitance modulation frequency (i.e., double the frequency of the AC voltage) of the capacitance changing structure (more specifically, the variable capacitance elements that construct the capacitance changing structure). As a result, a sufficient AC current can flow through the capacitance changing structure. This means that the precision with which a voltage can be detected using the AC current can be sufficiently increased.

The third variable capacitance circuit according to the present invention includes a capacitance changing structure constructed by connecting a first construction unit, a second construction unit, a third construction unit, and a fourth construction unit in the mentioned order in a ring, wherein the construction units in one pair out of a pair of the first construction unit and the second construction unit and a pair of the third construction unit and the fourth construction unit each include a first electric element that hinders transmission of a DC signal and has a capacitance that changes in accordance with the magnitude of an absolute value of an applied voltage and the construction units in the other pair each include a third electric element that hinders transmission of a DC signal but permits transmission of an AC signal.

In the third variable capacitance circuit described above, each third electric element may include at least one of a capacitor and a resonator.

According to this variable capacitance circuit, by constructing the third electric elements so as to include at least one of a capacitor and a resonator, it is possible to construct the variable capacitance circuit easily and at low cost. In particular, when the construction units in one pair or the other pair out of a pair of the first construction unit and the second construction unit and a pair of the third construction unit and the fourth construction unit are constructed so as to include resonators, and more specifically resonators where the impedance is minimized at a frequency (i.e., the capacitance modulation frequency) that is double the frequency of the driving AC voltage applied between the connection point of the first construction unit and the second construction unit and the connection point of the third construction unit and the fourth construction unit, and the impedance is sufficiently high at other frequencies, it is possible to reduce the impedance of the resonators at the capacitance modulation frequency (i.e., double the frequency of the AC voltage) of the capacitance changing structure (more specifically the variable capacitance elements that construct the capacitance changing structure), and as a result, a sufficient AC current can flow through the capacitance changing structure. This means that the precision with which the voltage can be detected using the AC current can be sufficiently increased.

In at least one of the variable capacitance circuits described above, each first electric element may be constructed by connecting two first devices, which each function as a resistor when the potential of a first end is higher than the other end and function as a capacitor when the potential of the first end is lower than the other end, in series with opposite orientations.

According to such variable capacitance circuits, by constructing the first electric elements by connecting two first devices that function as described above (for example, first devices formed by joining together a P-type semiconductor and an N-type semiconductor) in series with opposite orientations, it is possible to greatly miniaturize the variable capacitance circuit.

In the first variable capacitance circuit, each first electric element may be constructed by connecting two first devices, which each function as a resistor when the potential of a first end is higher than the other end and function as a capacitor when the potential of the first end is lower than the other end, in series with opposite orientations, one out of both first ends and both other ends of the two first devices included in the first construction unit and the second construction unit may be connected together, and the other out of both first ends and both other ends of the two first devices included in the third construction unit and the fourth construction unit may be connected together.

Alternatively, in the first variable capacitance circuit described above, each first electric element may be constructed by connecting two first devices, which each function as a resistor when the potential of a first end is higher than the other end and function as a capacitor when the potential of the first end is lower than the other end, in series with opposite orientations, one out of both first ends and both other ends of the two first devices included in the first construction unit and the third construction unit may be connected together, and the other out of both first ends and both other ends of the two first devices included in the second construction unit and the fourth construction unit may be connected together.

In the second variable capacitance circuit described above, each first electric element may be constructed by connecting two first devices, which each function as a resistor when the potential of a first end is higher than the other end and function as a capacitor when the potential of the first end is lower than the other end, in series with opposite orientations, and one out of both first ends and both other ends of the two first devices included in one construction unit out of the pair of construction units that include the first electric elements may be connected together and the other out of both first ends and both other ends of the two first devices included in the other construction unit may be connected together.

According to these variable capacitance circuits, by constructing first electric elements by connecting two first devices, which each function as a resistor when the potential of a first end is higher than the other end and function as a capacitor when the potential of the first end is lower than the other end, in series with opposite orientations, it is possible to greatly miniaturize the variable capacitance circuit. Also, by using any of the constructions described above when the capacitance changing structure is constructed of a mixture of electric elements that include a pair of first devices in a first connected state (a state where the first ends are connected together) and electric elements that include a pair of first devices in a second connected state (a state where the other ends are connected together), it is possible to dispose the first devices that function as capacitors in the capacitance changing structure during a capacitance changing operation at positions that exhibit left-right symmetry about a pair of opposing connection points. As a result, the potential difference between such a pair of connection points can be significantly reduced.

Here, each first device may include a P-type semiconductor and an N-type semiconductor that are joined together. By doing so, it is possible to greatly miniaturize the variable capacitance circuit.

Also, each first device may be composed of a diode formed of the P-type semiconductor and the N-type semiconductor. By doing so, it is possible to construct the variable capacitance circuit easily and cheaply.

In the variable capacitance circuit described above, the P-type semiconductors and the N-type semiconductors included in the two first devices that are connected in series with opposite orientations may be constructed of a single transistor that is disposed in a ring-shaped circuit composed of the four construction units with an input terminal and an output terminal of the transistor as connection points.

Alternatively, in the variable capacitance circuit described above, out of the first devices included in two adjacent construction elements out of the construction elements that include the first electric elements, the P-type semiconductors and the N-type semiconductors included in two first devices out of the first devices that have opposite orientations and are adjacent on both sides of a connection point between the two construction units may be constructed of a single transistor.

According to these variable capacitance circuits, by constructing the P-type semiconductors and the N-type semiconductors included in the two first devices in first electric elements of a single transistor, it is possible to construct the variable capacitance circuit easily, at low cost, and with fewer components.

In any of the variable capacitance circuits described above, a product of impedances of the first construction unit and the third construction unit may be set equal to or substantially equal to a product of impedances of the second construction unit and the fourth construction unit.

According to this variable capacitance circuit, by setting the product of impedances of the first construction unit and the third construction unit equal to or substantially equal to the product of impedances of the second construction unit and the fourth construction unit, it is possible to achieve a balanced state as a bridge circuit for the capacitance changing structure where components are connected in a ring to form a bridge circuit. As a result, when the driving AC voltage is applied between a pair of opposing connection points (a pair of non-adjacent connection points), it is possible to prevent voltage components of the AC voltage from being generated between the other pair of opposing connection points. This means that it is possible to eradicate the effect of the driving AC voltage on the current generated in the capacitance changing structure or the voltage across both ends of the capacitance changing structure while the electrostatic capacitance is changing.

Also, any of the variable capacitance circuits described above may further include a driving circuit that changes the electrostatic capacitance of the capacitance changing structure by applying an AC voltage between a connection point of the first construction unit and the second construction unit and a connection point of the third construction unit and the fourth construction unit.

According to these variable capacitance circuits, by including the driving circuit described above, it is possible to use the connection point of the first construction unit and the fourth construction unit of the capacitance changing structure and the connection point of the second construction unit and the third construction unit as a pair of connection points for connecting to another circuit in the variable capacitance circuit. This means that in addition to achieving a balanced state as a bridge circuit as described above, it is possible to eradicate the effect of the driving AC voltage on the AC current generated in the capacitance changing structure or the voltage across both ends of the capacitance changing structure while the electrostatic capacitance is changing (i.e., while the capacitance is being modulated).

In this case, the driving circuit may include a transformer that generates the AC voltage in a secondary winding thereof.

By constructing the driving circuit as described above, it is possible to easily supply (apply) the AC voltage to the capacitance changing structure in a floating state using a highly versatile component (i.e., a transformer) Also, by increasing the turn ratio of the secondary winding with respect to the primary winding, it is possible to supply an AC voltage with a higher voltage to the capacitance changing structure. Since it is possible to increase the capacitance modulation range of the capacitance changing structure, when the variable capacitance circuit is used in a voltage measuring apparatus, for example, it is possible to measure the voltage of a measured object with high sensitivity.

A voltage measuring apparatus according to the present invention measures the voltage of a measured object and includes: a detection electrode capable of being disposed facing the measured object; and the variable capacitance circuit described above that includes the driving circuit, wherein the variable capacitance circuit is connected between the detection electrode and a reference potential so that a connection point of the first construction unit and the fourth construction unit is positioned on a detection electrode side of the variable capacitance circuit and a connection point of the second construction unit and the third construction unit is positioned on a reference potential side of the variable capacitance circuit.

According to this voltage measuring apparatus, the apparatus includes a detection electrode capable of being disposed facing the measured object and the variable capacitance circuit described above, the variable capacitance circuit is connected between the detection electrode and the reference potential so that the connection point of the first construction unit and the fourth construction unit is positioned on the detection electrode side and the connection point of the second construction unit and the third construction unit is positioned on the reference potential side, and the voltage of the measured object is measured using a capacitance changing operation of the variable capacitance circuit. Since the variable capacitance circuit is capable of capacitance changing operations at high frequency and has high reliability compared to a construction that uses a variable capacitance circuit including a mechanically movable structure, it is possible to measure the voltage of the measured object in a short time and to improve the reliability of the voltage measuring apparatus itself.

The voltage measuring apparatus described above may further include a voltage generating circuit that generates the reference potential and a control unit, wherein the control unit causes the voltage generating circuit to change the voltage of the reference potential while the electrostatic capacitance of the variable capacitance circuit is changing.

According to this voltage measuring apparatus, by having the control unit cause the voltage generating circuit to change the voltage of the reference potential while the electrostatic capacitance of the variable capacitance circuit is changing and making use of the current flowing between the detection electrode and the reference potential via the variable capacitance circuit or the voltage generated between the detection electrode end and the reference potential end of the capacitance changing structure of the variable capacitance circuit becoming substantially zero when the voltage of the changed reference potential matches the voltage of the measured object, it is possible to measure the voltage of the measured object with high precision.

In the voltage measuring apparatus described above, while the electrostatic capacitance is changing, the control unit may cause the voltage generating circuit to change the voltage of the reference potential so that one of a current flowing via the variable capacitance circuit between the detection electrode and the reference potential and a voltage generated between a detection electrode end and a reference potential end of the variable capacitance circuit decreases.

According to this voltage measuring apparatus, by having the control unit cause the voltage generating circuit to change the voltage of the reference potential while the electrostatic capacitance of the variable capacitance circuit is changing, it is possible to make the voltage of the reference potential match the voltage of the measured object reliably and in a short time. This means that it is possible to measure the voltage of the measured object reliably and in a short time while maintaining high measurement precision.

The voltage measuring apparatus described above may further include an impedance element disposed in series with the variable capacitance circuit between the detection electrode and the reference potential, and the control unit may cause the voltage generating circuit to change the voltage of the reference potential so that a voltage generated in the impedance element when the current flows through the impedance element decreases.

According to this voltage measuring apparatus, by having the control unit cause the voltage generating circuit to change the voltage of the reference potential so that the voltage generated in the impedance element when the current flows through the impedance element decreases, by changing the impedance value of the impedance element, it is possible to freely change the voltage of the impedance element when the current flows. This means that the voltage of the measured object can be accurately measured across a wide voltage range from a low voltage to a high voltage.

Also, the voltage measuring apparatus described above may further include a resonance circuit disposed in series with the variable capacitance circuit between the detection electrode and the reference potential, wherein the control unit may cause the voltage generating circuit to change the voltage of the reference potential so that a voltage generated in the resonance circuit when the current flows through the resonance circuit decreases.

According to this voltage measuring apparatus, by changing the impedance value of the resonance circuit when the resonance circuit resonates, it is possible to freely change the voltage generated in the resonance circuit when the current flows. This means that the voltage of the measured object can be measured across a wide voltage range from a low voltage to a high voltage. In addition, by changing the electrostatic capacitance of the variable capacitance circuit at the resonance frequency of the resonance circuit, it is possible to detect the current flowing in the resonance circuit as a larger voltage. This results in increased resistance to noise, so that it is possible to measure the voltage of the measured object with little error.

The voltage measuring apparatus described above may further include a transformer including a primary winding disposed in series with the variable capacitance circuit between the detection electrode and the reference potential and a secondary winding that is magnetically coupled to the primary winding, wherein the control unit may cause the voltage generating circuit to change the voltage of the reference potential so that a voltage generated in the secondary winding decreases.

According to this voltage measuring apparatus, it is possible to easily construct the circuits on the secondary winding side as circuits that use ground potential ("base potential") as a reference. Accordingly, when using a circuit construction that uses an operational amplifier, for example, since it is possible to use a single-ended operational amplifier that is inexpensive compared to a differential operational amplifier, it is possible to reduce the cost of the entire apparatus. Also, by using an insulating electronic component, it is possible to electrically insulate the voltage inputted into the operational amplifier from the current flowing in the variable capacitance circuit and possible to freely set the voltage level inputted into the operational amplifier, so that even if the voltage of the measured object to be measured is extremely high, it will be easy to make the signal level of the voltage inputted into the operational amplifier conform to the input specification of the operational amplifier.

In a voltage measuring apparatus where the voltage of the reference potential is changed so that the voltage generated in the resonance circuit or in the secondary winding decreases, the control unit may include an A/D conversion circuit that receives an input of a detection signal whose voltage changes in accordance with a value of the current or a value of the voltage generated between the detection electrode end and the reference potential end and converts the detection signal to digital data, and the control unit may cause the voltage generating circuit to change the voltage of the reference potential based on the digital data so that the voltage of the detection signal decreases.

Since this voltage measuring apparatus includes an A/D conversion circuit that receives an input of a detection signal whose voltage changes in accordance with a value of the current flowing in the variable capacitance circuit or a value of the voltage generated in the variable capacitance circuit and converts the detection signal to digital data, and the control unit causes the voltage generating circuit to change the voltage of the reference potential based on the digital data so that the voltage of the detection signal decreases, the control unit can be easily constructed using a digital circuit that uses a CPU or a DSP (Digital Signal Processor).

A power measuring apparatus according to the present invention includes: a current measuring apparatus that measures current flowing through a measured object; and any of the voltage measuring apparatuses described above that measures the voltage of the measured object, wherein the power measuring apparatus measures power based on the current measured by the current measuring apparatus and the voltage measured by the voltage measuring apparatus.

This power measuring apparatus includes a current measuring apparatus that measures current flowing through a measured object and any of the voltage measuring apparatuses described above that measures the voltage of the measured object, and measures the power supplied to the measured object for example based on the current measured by the current measuring apparatus and the voltage measured by the voltage measuring apparatus. According to this power measuring apparatus, by including a voltage measuring apparatus that is highly reliable, it is possible to sufficiently improve the reliability of the power measuring apparatus itself.

It should be noted that the disclosure of the present invention relates to the contents of Japanese Patent Application No. 2005-365666 that was filed on 20 Dec. 2005 and Japanese Patent Application No. 2006-231491 that was filed on 29 Aug. 2006, the entire contents of which are herein incorporated by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Preferred embodiments of a variable capacitance circuit, a voltage measuring apparatus, and a power measuring apparatus according to the present invention will now be described with reference to the attached drawings.

First, a voltage measuring apparatus 1 according to the present invention will be described with reference to the drawings.

Figure 1:
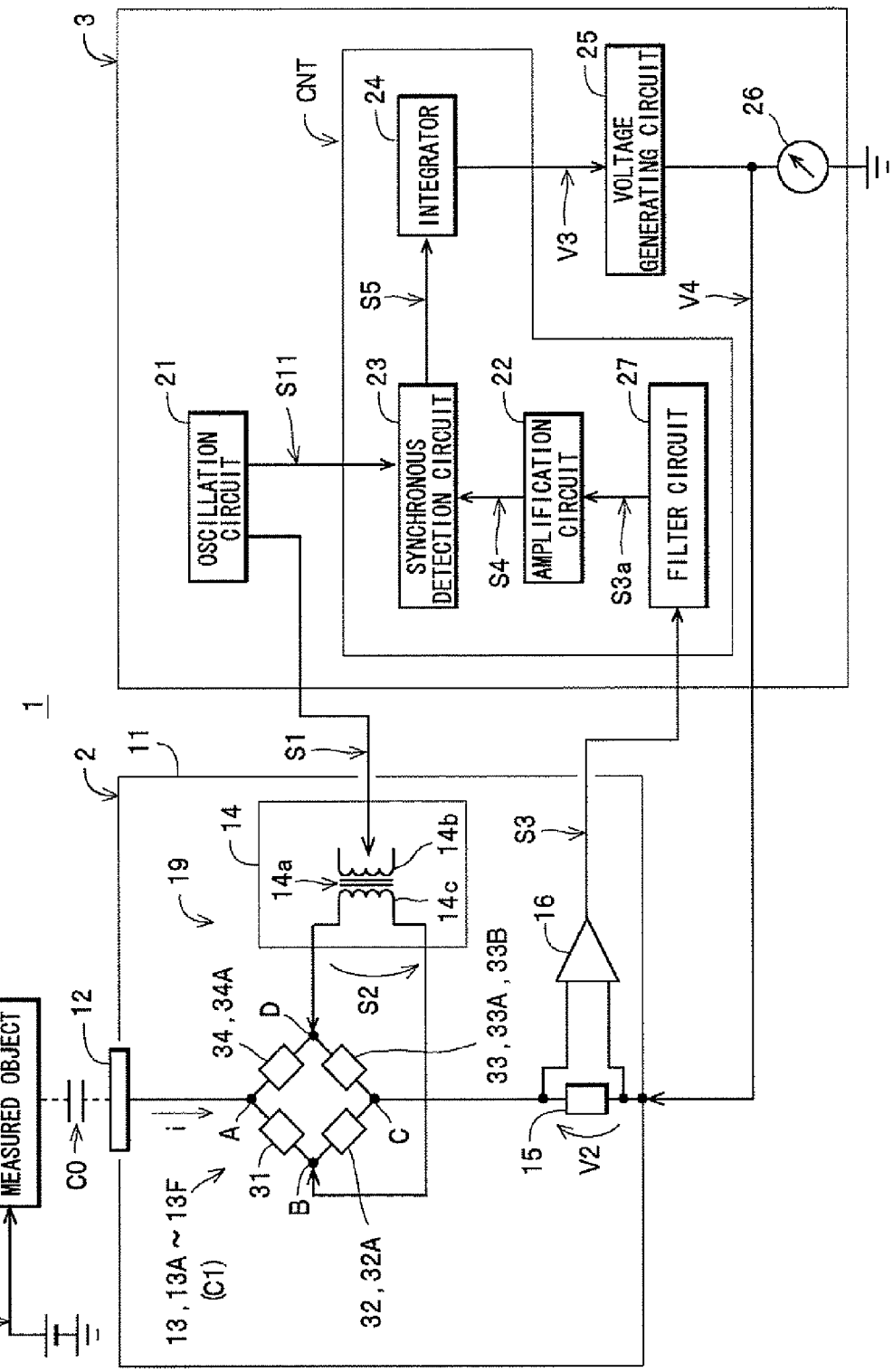
FIG. 1 is a block diagram of a voltage measuring apparatus.

As shown in FIG. 1, the voltage measuring apparatus 1 includes a probe unit 2 and a main unit 3 and is constructed so as to be capable of measuring a voltage V1 of a measured object 4 without contacting the measured object 4. Here, the expression "voltage V1" refers to a voltage relative to ground potential (a "base potential").

As shown in FIG. 1, the probe unit 2 includes a case 11, a detection electrode 12, a variable capacitance circuit 19, a current detector 15, and a preamp 16. The case 11 is constructed using a conductive material (for example, a metal material). The detection electrode 12 is formed in a plate-like shape, for example, and is fixed to the case 11 so that one surface thereof is exposed to an outer surface of the case 11 and the other surface thereof is exposed to the inside of the case 11. As one example, the detection electrode 12 is attached to a hole (not shown) provided in the case 11 so as to cover the hole and is electrically insulated from the case 11. Also, in the present embodiment, as one example, the surface of the case 11 is covered with an insulating film formed of a resin material or the like. The detection electrode 12 may be covered with the insulating film or may be exposed from the insulating film.

As shown in FIG. 1, the variable capacitance circuit (a "first variable capacitance circuit" for the present invention) 19 is equipped with a single capacitance changing structure 13 and a single driving circuit 14. The variable capacitance circuit 19 (more specifically, the capacitance changing structure 13) is constructed of a so-called "bridge circuit" (a "ring-shaped circuit" for the present invention) where a first construction unit 31, a second construction unit 32, a third construction unit 33, and a fourth construction unit 34 are connected in the mentioned order in a ring. More specifically, as shown in FIG. 2, the construction units 31 to 34 each include one first electric element respectively numbered E11, E12, E13, and E14 (hereinafter collectively referred to as the "first electric elements E1" where no distinction is required).

Each first electric element E1 includes a pair of first devices 41a, 41b (hereinafter collectively referred to as the "first devices 41" where no distinction is required) that respectively function as a resistor when the potential at a first end of the device is higher than at the other end and function as a capacitor when the potential at the other end of the device is higher than at the first end, with the first devices 41 being connected in series with opposite orientations. In this way, each first electric element E1 is constructed so as to hinder the transmission of a DC signal and so that its capacitance changes in accordance with the magnitude of the absolute value of the applied voltage. Note that in this specification, the expression "hinder the transmission of a DC signal" is a concept that includes both completely blocking the transmission of a DC signal and the limiting of transmission of a DC signal using a resistance of 100 MΩ or above, for example. In the present embodiment, as one example, each first device 41 is constructed of a P-type semiconductor and an N-type semiconductor that are joined together, and in more detail is constructed of a single diode (as one example, a variable-capacitance diode, also referred to as a varicap or a varactor diode). Each first electric element E1 is constructed of two of such diodes that are connected in series with opposite orientations (i.e., the anode terminals of the diodes are connected together). Variable-capacitance diodes with the same or substantially the same characteristics are used as the first devices 41a, 41b, and the product of the respective impedances of the first construction unit 31 and the third construction unit 33 and the product of the respective impedances of the second construction unit 32 and the fourth construction unit 34 are set equal or substantially equal (as one example, a state where the products differ within a range of only a few percent).

Figure 2:
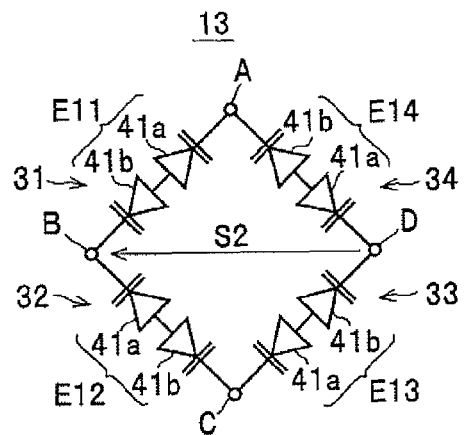
FIG. 2 is a circuit diagram of a capacitance changing structure used in a first variable capacitance circuit of the voltage measuring apparatus.
Figure 3:
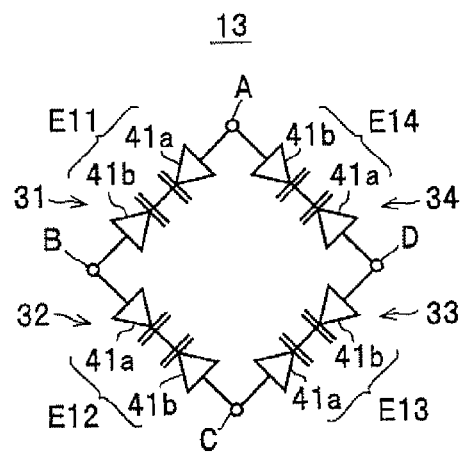
FIG. 3 is another circuit diagram of the capacitance changing structure used in the first variable capacitance circuit of the voltage measuring apparatus.

Note that although each first electric element E1 in the capacitance changing structure 13 shown in FIG. 2 is constructed by connecting together the first ends of a pair of first devices 41a, 41b (i.e., by connecting together the anode terminals of a pair of diodes), like the capacitance changing structure 13 shown in FIG. 3, it is also possible to construct each first electric element E1 by connecting together the other ends of the pair of first devices 41a, 41b (i.e., by connecting together the cathode terminals of a pair of diodes). Also, the expression "variable-capacitance diode" refers to a device that makes use of the change in electrostatic capacitance (junction capacitance) caused by a change in the thickness of the depletion layer at the PN junction of the diode when a voltage is applied in the reverse direction, and boosts this change in electrostatic capacitance. With a standard diode (silicon diode) constructed of a PN junction, the change in electrostatic capacitance (junction capacitance) described above also occurs, but such change is smaller compared to a variable-capacitance diode. Accordingly, it is possible to construct the capacitance changing structure 13 by using a construction where all of the first devices 41a, 41b of the capacitance changing structures 13 shown in FIGS. 2 and 3 are replaced with first devices 51a, 51b composed of normal diodes (hereinafter collectively referred to as the "first devices 51" where no distinction is required).

Also, the variable capacitance circuit 19 is disposed between the detection electrode 12 and the position that serves as the reference potential (in the present embodiment, the case 11) so that the connection point A of the first construction unit 31 and the fourth construction unit 34 is positioned on the detection electrode 12 side of the capacitance changing structure 13 and the connection point C of the second construction unit 32 and the third construction unit 33 is positioned on the case 11 side. More specifically, as shown in FIG. 1, the variable capacitance circuit 19 is disposed so that the connection point A of the capacitance changing structure 13 is connected to the detection electrode 12 and the connection point C of the capacitance changing structure 13 is connected via the current detector 15 to the case 11. The connection point B of the first construction unit 31 and the second construction unit 32 and the connection point D of the third construction unit 33 and the fourth construction unit 34 are connected to the driving circuit 14. The variable capacitance circuit 19 is disposed inside the case 11 so that the variable capacitance circuit 19 is not exposed to outside of the case 11.

As one example, the driving circuit 14 is constructed using insulating electronic components such as a transformer or a photocoupler, converts a driving signal S1 inputted from the main unit 3 to a driving signal S2 (an "AC voltage" for the present invention) that is electrically insulated from the driving signal S1 but has the same frequency f1 as the driving signal S1, and outputs (applies) the driving signal S2 to the capacitance changing structure 13. In the present embodiment, as one example, as shown in FIG. 1, the driving circuit 14 includes a transformer 14a where ends of the secondary winding 14c are connected to the connection points B and D of the capacitance changing structure 13 and the primary winding 14b of the transformer 14a is excited based on the inputted driving signal S1, thereby causing the driving signal S2 to be generated in the secondary winding 14c. By using this construction, the driving circuit 14 converts the driving signal S1 to the driving signal S2 with low distortion and the driving signal S2 is applied across the connection points B, D of the capacitance changing structure 13. As described later, since an example where a sine wave signal is used as the driving signal S1 is described in the present embodiment, the driving signal S2 is also outputted as a sine wave signal. Note that in place of the driving circuit 14 described above, a floating signal source (not shown) that outputs the driving signal S2 by itself (i.e., without a driving signal S1 being inputted from the main unit 3) can be disposed inside the probe unit 2.

The current detector 15 is constructed of a resistor, for example, and is connected between the variable capacitance circuit 19 (more specifically the capacitance changing structure 13 of the variable capacitance circuit 19) and the case 11. By doing so, the current detector 15 is disposed between the detection electrode 12 and the case 11 so as to be connected in series to the variable capacitance circuit 19, detects the current i (physical value) flowing through the capacitance changing structure 13 of the variable capacitance circuit 19 and generates a voltage V2 across the ends of the current detector 15 whose magnitude is proportional to the magnitude of the current i and whose polarity corresponds to the direction of the current i. The preamp 16 includes a pair of capacitors, not shown, that function as a DC circuit breaker, an amplification circuit such as an operational amplifier, not shown, and an insulating electronic component (a transformer, a photocoupler, or the like), also not shown. In the present embodiment, the preamp 16 is constructed of a differential operational amplifier, for example, amplifies the voltage V2 inputted via the capacitors using the amplification circuit, converts the amplified voltage to a detection signal S3 that is electrically insulated from the amplification circuit by the insulating electronic component, and outputs the detection signal S3. Here, since the voltage V2 changes in proportion to the magnitude of the current i, the detection signal S3 generated by amplifying the voltage V2 also changes in proportion to the magnitude of the current i. The current detector 15 and the preamp 16 described above are disposed inside the case 11 together with the variable capacitance circuit 19.

As shown in FIG. 1, the main unit 3 includes an oscillation circuit 21, an amplification circuit 22, a synchronous detection circuit 23, an integrator 24, a voltage generating circuit 25, a voltmeter 26, and a filter circuit 27. The oscillation circuit 21 generates the driving signal S1 that has a constant cycle T1 (a frequency f1), outputs the driving signal S1 to the probe unit 2, and generates a wave detection signal S11 of a cycle T2 that is half the cycle T1 (i.e., the wave detection signal S11 has a frequency of (2×f1)) in synchronization with the driving signal S1 and outputs the wave detection signal S11 to the synchronous detection circuit 23. In the present embodiment, the oscillation circuit 21 generates sine wave signals as the driving signal S1 and the wave detection signal S1. The filter circuit 27 selectively transmits a signal S3a with the same frequency as the capacitance modulation frequency of the capacitance changing structure 13 included in the detection signal S3 inputted from the probe unit 2.

The amplification circuit 22 amplifies the signal S3a inputted from the filter circuit 27 to a voltage level set in advance and outputs the result as a detection signal S4. In the present embodiment, the capacitance modulation frequency of the capacitance changing structure 13 is a frequency f2 that is double the frequency f1 of the driving signal S2. This means that the frequency of the current i generated due to changes in the electrostatic capacitance C1 is the frequency f2 that is double the frequency f1 of the driving signal S1, and although signal components of the frequencies f1 and f2 are included in the detection signal S3 generated by the preamp 16, the frequency of the detection signal S4 outputted from the amplification circuit 22 is f2 due to the filtering by the filter circuit 27. The synchronous detection circuit 23 is constructed to detect the detection signal S4 in synchronization with the wave detection signal S11 to generate a pulse signal S5. The amplitude of the pulse signal S5 changes in proportion to the current i flowing through the variable capacitance circuit 19 and the polarity of the pulse signal S5 changes in accordance with the direction of the current i flowing through the variable capacitance circuit 19.

The integrator 24 generates a DC voltage V3 by continuously integrating the pulse signal S5 and outputs the DC voltage V3 to the voltage generating circuit 25. In the present embodiment, as one example, the integrator 24 is set so as to output a DC voltage V3 of zero volts in a period until the first pulse signal S5 is inputted following the start of an integration operation. The filter circuit 27, the amplification circuit 22, the synchronous detection circuit 23, and the integrator 24 construct a control unit CNT that controls the voltage generating circuit 25. Under control by the control unit CNT, the voltage generating circuit 25 generates a feedback voltage V4 and applies the feedback voltage V4 to the case 11 of the probe unit 2. More specifically, the voltage generating circuit 25 amplifies the inputted DC voltage V3 to generate the feedback voltage V4. By doing so, the voltage of the case 11 at the reference potential is kept equal to the feedback voltage V4. The voltmeter 26 measures the feedback voltage V4 relative to ground potential (the "base potential") and displays the voltage.

Next, the method of measuring the voltage V1 of the measured object 4 using the voltage measuring apparatus 1 and a measuring operation of the voltage measuring apparatus 1 will be described. Note that for ease of understanding the present invention, an example where the voltage V1 is a constant positive voltage will be described, but when the voltage V1 is a constant negative voltage, measuring is carried out in the same way except that the polarities of the corresponding signals and voltages are inverted. Also, if the voltage V1 is an AC voltage, in principle measuring can be carried out in the same way as when the voltage V1 is a constant positive DC voltage or a constant negative DC voltage.

First, when measuring the voltage V1, the probe unit 2 is positioned near the measured object 4 so that the detection electrode 12 faces but does not contact the measured object 4. By doing so, as shown in FIG. 1, the electrostatic capacitance C0 is formed between the detection electrode 12 and the measured object 4. Here, the value of the electrostatic capacitance C0 changes inversely proportionally to the distance between the detection electrode 12 and the measured object 4, but once the probe unit 2 has been positioned, the electrostatic capacitance C0 will become constant (i.e., will not vary) so long as environmental conditions such as humidity are constant. However, if environmental conditions such as humidity do change, the electrostatic capacitance C0 will vary.

Next, in the operating state of the voltage measuring apparatus 1, inside the main unit 3 the oscillation circuit 21 starts generating the driving signal S1 and the wave detection signal S11 and outputs the driving signal S1 to the probe unit 2 and the wave detection signal S11 to the synchronous detection circuit 23. In the probe unit 2, the driving circuit 14 of the variable capacitance circuit 19 converts the inputted driving signal S1 to the driving signal S2 and applies (outputs) the driving signal S2 between the connection points B and D of the capacitance changing structure 13. In the capacitance changing structure 13, the driving signal S2 applied between the connection points B and D is divided and applied to the first construction unit 31, the second construction unit 32, the third construction unit 33, and the fourth construction unit 34.

Figure 6:
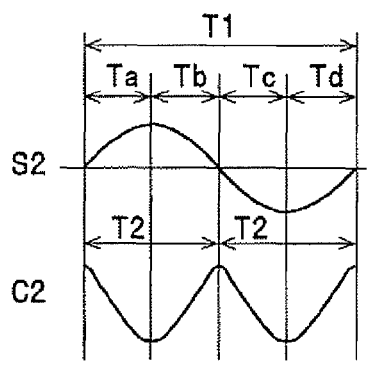
FIG. 6 is a diagram showing the relationship between a driving signal and electrostatic capacitance which is useful in explaining the operation of the capacitance changing structure.

As shown in FIG. 6, during a period Ta out of one cycle T1 of the driving signal S2 (i.e., a period where the potential of the connection point B is high relative to the potential of the connection point D and the potential difference between such points gradually increases), a reverse voltage is applied to the first devices 41 (the first devices 41 of the first electric elements E1) that function as capacitors (i.e., the first devices are reverse biased) and the electrostatic capacitances of the first devices 41 gradually decrease. More specifically, in the first electric elements E11 and E14, the electrostatic capacitances of the first devices 41b that are reverse biased gradually decrease and in the first electric elements E12 and E13, the electrostatic capacitances of the first devices 41a that are reverse biased gradually decrease. During the period Tb out of the cycle T1 of the driving signal S2 (i.e., a period where the potential of the connection point B is high relative to the potential of the connection point D but where the potential difference between such points gradually decreases), the electrostatic capacitances of the reversed-biased first devices 41, more specifically, the first devices 41b in the first electric elements E11 and E14 and the first devices 41a in the first electric elements E12 and E13 gradually increase.

During the period Tc out of the cycle T1 of the driving signal S2 (i.e., a period where the potential of the connection point B is low relative to the potential of the connection point D and the potential difference between such points gradually increases), the electrostatic capacitances of the first devices 41 that function as reverse-biased capacitors, more specifically, the first devices 41a in the first electric elements E11 and E14 and the first devices 41b in the first electric elements E12 and E13 gradually decrease. During the period Td out of the cycle T1 of the driving signal S2 (i.e., a period where the potential of the connection point B is low relative to the connection point D and the potential difference between such points gradually decreases), the electrostatic capacitances of the reverse-biased first devices, more specifically, the first devices 41a in the first electric elements E11 and E14 and the first devices 41b in the first electric elements E12 and E13 gradually increase. Note that out of the first devices 41a and 41b included in the first electric elements E1, the first devices 41a and 41b to which a forward voltage is applied (i.e., the first devices 41a and 41b that are forward biased) function equivalently as resistors. As described above, the electrostatic capacitances of the first electric elements E1 decrease and increase twice within one cycle T1 of the driving signal S2.

In this way, since the electrostatic capacitances of the first electric elements E1 included in the construction units 31 to 34 increase and decrease twice in one cycle T1 of the driving signal S2, the electrostatic capacitance C1 of the capacitance changing structure 13 that is a combination of such electrostatic capacitances (i.e., the electrostatic capacitance between the connection points A, B) increases and decreases twice. That is, the variable capacitance circuit 19 carries out an operation that continuously (cyclically in the present embodiment) changes the electrostatic capacitance C1 of the variable capacitance circuit 19 with a cycle T2 that is half the cycle T1 (i.e., with a frequency f2=2×f1) in synchronization with the cycle T1 of the inputted driving signal S2. Here, as described above, since the variable capacitance circuit 19 is connected in series between the case 11 and the detection electrode 12 via the current detector 15, the electrostatic capacitance C1 and the electrostatic capacitance C0 formed between the measured object 4 and the detection electrode 12 are connected in series between the measured object 4 and the case 11. This means that by cyclically changing the electrostatic capacitance C1 with the frequency f2 (the capacitance modulation frequency), the electrostatic capacitance C2 between the measured object 4 and the case 11 (that is, the combined serial capacitance of the electrostatic capacitances C0 and C1) will also change as shown in FIG. 6 in synchronization with the cycle T1 of the driving signal S2 and with a cycle T2 that is half of the cycle T1 (i.e., at the frequency f2).

As described above, in the variable capacitance circuit 19, variable-capacitance diodes (or normal diodes) with the same or substantially the same characteristics are used as the first devices 41 of the capacitance changing structure 13. As a result, the product of the respective impedances of the first construction unit 31 and the third construction unit 33 and the product of the respective impedances of the second construction unit 32 and the fourth construction unit 34 are set equal or substantially equal. Accordingly, since the capacitance changing structure 13 which is also a bridge circuit satisfies a balanced state for a bridge circuit, the electrostatic capacitance C1 of the capacitance changing structure 13 changes with the cycle T2 with hardly any voltage component of the driving signal S2 (a voltage signal with the same frequency f1 as the driving signal S1) being produced between the connection points A and C. Since two first electric elements E1 included in at least one pair out of the pair of the first electric elements E11 and E14 included in the construction units 31 and 34 that are connected to the connection point A and the pair of the first electric elements E12 and E13 included in the construction units 32 and 33 that are connected to the connection point C will always function as capacitors, the detection electrode 12 and the case 11 are connected for alternating current via the variable capacitance circuit 19 without being short-circuited for direct current.

Since the integrator 24 of the main unit 3 outputs the DC voltage V3 of zero volts immediately after the voltage measuring apparatus 1 starts operating, the voltage generating circuit 25 generates the feedback voltage V4 of a predetermined voltage (as one example, a voltage that is lower than the voltage V1 and is substantially zero volts) and applies the feedback voltage V4 to the case 11 of the probe unit 2. This means that a potential difference (V1−V4) is generated between the measured object 4 and the case 11. Accordingly, by cyclically changing the electrostatic capacitance C2 with the cycle T2 between the measured object 4 and the case 11 based on the cyclical changes in the electrostatic capacitance C1 with the cycle T2 as described above, a current i (with the cycle T2) with an amplitude that corresponds to the potential difference (V1−V4) between the voltages V1 and V4 of the measured object 4 and the case 11 flows through the variable capacitance circuit 19. Here, the amplitude (i.e., magnitude) of the current i increases when the potential difference (V1−V4) is large and decreases when the potential difference (V1−V4) is small. That is, although not shown, the current i flows as an AC signal whose cycle is the cycle T2 and whose amplitude changes in accordance with the potential difference (V1−V4). The preamp 16 amplifies the voltage V2 generated across both ends of the current detector 15 due to the current i flowing and outputs the amplified voltage to the main unit 3 as the detection signal S3. Here, the detection signal S3 includes components with the same frequency as the frequency f2 of the current i and components with the same frequency as the frequency f1 of the driving signal S2.

Figure 7:
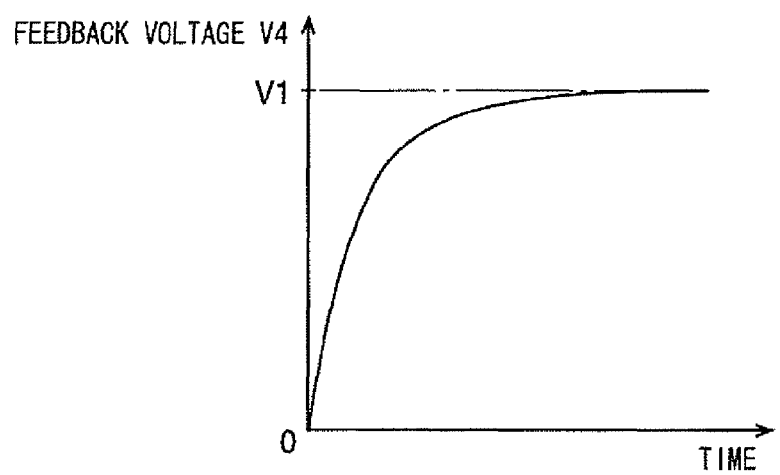
FIG. 7 is a characteristics graph showing changes over time in a feedback voltage.

In the control unit CNT of the main unit 3, the filter circuit 27 selectively outputs the signal components with the frequency f2 included in the detection signal S3 as the signal S3a, the amplification circuit 22 amplifies the signal S3a to generate the detection signal S4, and outputs the detection signal S4 to the synchronous detection circuit 23. Next, the synchronous detection circuit 23 detects the inputted detection signal S4 in synchronization with the wave detection signal S11 to generate the pulse signal S5 and outputs the pulse signal S5 to the integrator 24. After this, the integrator 24 generates the DC voltage V3 by continuously integrating the pulse signal S5 and outputs the DC voltage V3 to the voltage generating circuit 25. Here, as described above, in the present embodiment, until the feedback voltage V4 reaches the voltage V1 after the voltage measuring apparatus 1 has started operating, the detection signal S3 will always be a positive signal and since the detection signal S4 also becomes a positive signal in the same way, the pulse signal S5 is always a positive pulse signal. As a result, the magnitude of the DC voltage V3 outputted from the integrator 24, or in other words, from the control unit CNT gradually increases. Accordingly, the magnitude of the feedback voltage V4 generated by the voltage generating circuit 25 also gradually increases as shown in FIG. 7. As a result, inside the feedback loop constructed of the current detector 15, the preamp 16, the filter circuit 27, the amplification circuit 22, the synchronous detection circuit 23, the integrator 24, and the voltage generating circuit 25, there is negative feedback so that the potential difference (V1−V4) between the measured object 4 and the case 11 gradually decreases (falls). Accordingly, the magnitude of the current i gradually decreases (falls).

After this, when the feedback voltage V4 reaches the voltage V1, the potential difference (V1−V4) becomes zero volts.

In this state, even if the electrostatic capacitance C2 between the measured object 4 and the case 11 cyclically changes, the current i will not flow. Since the current i does not flow, the current detector 15 does not generate the voltage V2 (i.e., the voltage V2 becomes zero) and the detection signal S3 is no longer outputted from the preamp 16. Since the detection signal S3 is not outputted, the detection signal S4 is also not outputted from the amplification circuit 22, the outputting of the pulse signal S5 from the synchronous detection circuit 23 is stopped, and as a result, the DC voltage V3 outputted from the integrator 24 stops increasing and is maintained at a constant voltage. This means that the feedback voltage V4 outputted from the voltage generating circuit 25 stops increasing and as shown in FIG. 7 is maintained at a constant voltage. Accordingly, the voltage (the feedback voltage V4) displayed by the voltmeter 26 is continuously observed, and when the voltage has stopped increasing and has become constant (that is, when the current i has become zero amps), the voltage (the feedback voltage V4) displayed by the voltmeter 26 at that time is measured as the voltage V1 of the measured object 4. By doing so, the measuring of the voltage V1 of the measured object 4 is completed. Note that by increasing the gain of the amplification circuit 22, the voltage generating circuit 25, and the like, it is possible to sufficiently increase the response speed of the feedback loop described above of the voltage measuring apparatus 1. In this case, since it is possible to make the feedback voltage V4 sufficiently track a voltage V1 that varies, it is possible to measure the voltage displayed by the voltmeter 26 as the voltage V1 of the measured object 4 without waiting for the displayed value to stabilize.

In this way, in the voltage measuring apparatus 1, the capacitance changing structure 13 is constructed by connecting the first construction unit 31, the second construction unit 32, the third construction unit 33, and the fourth construction unit 34 (which respectively include the first electric elements E1 that hinder the transmission of a DC signal and have capacitances that change in accordance with the magnitude of the amplitude of the applied voltage) in the mentioned order in a ring. Accordingly, since the variable capacitance circuit 19 that uses the capacitance changing structure 13 does not include a mechanically movable structure, it is possible to provide a variable capacitance circuit that is capable of capacitance changing operations at a high frequency of several hundred kHz to several MHz (i.e., a variable capacitance circuit whose operating frequency can be raised) and that has high reliability.

In the voltage measuring apparatus 1 that uses the variable capacitance circuit 19, in a state where the detection electrode 12 has been disposed facing the measured object 4 so that a constant (i.e., fixed) electrostatic capacitance C0 is formed between the measured object 4 and the detection electrode 12, the electrostatic capacitance C1 of the capacitance changing structure 13 of the variable capacitance circuit 19 is cyclically changed and the voltage V1 of the measured object 4 is measured using a capacitance changing operation of the capacitance changing structure 13. Accordingly, according to the voltage measuring apparatus 1, compared to a construction that uses a variable capacitance circuit including a mechanically movable structure, the reliability of the voltage measuring apparatus itself is sufficiently increased and it is possible to carry out control of the feedback voltage V4 at a high frequency of several hundred kHz to several MHz. As a result, it is possible to measure the voltage V1 of the measured object 4 in a short time. In addition, according to the voltage measuring apparatus 1, since the voltage V1 of the measured object 4 can be measured in a state where the detection electrode 12 is disposed on the surface of the case 11 and the variable capacitance circuit 19 is disposed inside the case 11, it is not necessary to provide the case 11 with a hole for positioning the variable capacitance circuit 19 directly facing the measured object 4. As a result, it is possible to reliably avoid having foreign matter erroneously inserted into the case 11 via the hole and to avoid damage to components inside the case 11 due to such erroneous insertion, and therefore the reliability of the voltage measuring apparatus 1 can be further improved.

According to the voltage measuring apparatus 1, the control unit CNT causes the voltage generating circuit 25 to change the feedback voltage V4 while the electrostatic capacitance C1 of the capacitance changing structure 13 of the variable capacitance circuit 19 is cyclically changing. This means that according to the voltage measuring apparatus 1, by detecting the current i generated (flowing) in the capacitance changing structure 13 while the capacitance of the capacitance changing structure 13 is cyclically changing and measuring the feedback voltage V4 at a point when the current i has become zero amps as the voltage V1 of the measured object 4, it is possible to measure the voltage V1 of the measured object 4 with high precision. In addition, according to the voltage measuring apparatus 1, by having the control unit CNT cause the voltage generating circuit 25 to change the voltage of the feedback voltage V4 so that the detected current i falls, it is possible to cause the feedback voltage V4 to match the voltage V1 of the measured object 4 reliably and in a short time. As a result, it is possible to measure the voltage V1 of the measured object 4 reliably and in a short time while maintaining high precision. In particular, according to the voltage measuring apparatus 1 since the electrostatic capacitance C2 between the measured object 4 and the case 11 is changed at the high frequency described earlier, it is possible to increase the response speed of the feedback loop constructed of the current detector 15 to the voltage generating circuit 25, and as a result, it is possible to measure the voltage V1 of the measured object 4 in a significantly shorter time. This means that according to the voltage measuring apparatus 1, the voltage V1 of the measured object 4 can be correctly measured even when the voltage V1 varies over time or when the voltage V1 is an AC voltage that changes cyclically.

Also, according to the variable capacitance circuit 19, by constructing the construction units 31 to 34 so as to include the first electric elements E1 that hinder the transmission of a DC signal and have capacitances that change in accordance with the magnitude of the absolute value of the applied voltage as described earlier, it is possible to change the electrostatic capacitance C1 with the frequency f2 that is double the frequency f1 of the driving signal S2. Therefore, according to the voltage measuring apparatus 1, since it is possible to significantly increase the response speed of the feedback loop constructed of the current detector 15 to the voltage generating circuit 25 by using the variable capacitance circuit 19, it is possible to measure the voltage V1 of the measured object 4 in a significantly shorter time. In particular, by constructing the first electric elements E1 of the first devices that each function as a resistor when the first end has a higher potential than the other end and as a capacitor when the first end has a lower potential than the other end (more specifically, first devices where a P-type semiconductor and an N-type semiconductor are joined together, i.e., first devices constructed of diodes), the capacitance changing structure 13 and in turn the variable capacitance circuit 19 can be greatly miniaturized and can be constructed easily and at low cost.

By including the driving circuit 14 that applies the driving signal S2 between the connection point B of the first construction unit 31 and the second construction unit 32 of the capacitance changing structure 13 and the connection point D of the third construction unit 33 and the fourth construction unit 34 and constructing the variable capacitance circuit 19 so that the product of the impedances of the first construction unit 31 and the third construction unit 33 and the product of the impedances of the second construction unit 32 and the fourth construction unit 34 are equal or substantially equal (i.e., so that a balanced state as a bridge circuit is achieved), when the driving signal S2 is applied between the connection points B and D, it will be possible to change the electrostatic capacitance C1 of the variable capacitance circuit 19 with the cycle T2 in a state where hardly any voltage components of the driving signal S2 (i.e., a voltage signal of the same frequency f1 as the driving signal S2) are generated between the connection points A and C (a state where even if such voltage components are generated, the voltage signal will have an extremely low level). This means that according to the voltage measuring apparatus 1 that uses the variable capacitance circuit 19, it is possible to eradicate the effect of the driving signal S2 on the current i generated in the variable capacitance circuit 19 while the electrostatic capacitance is changing. As a result, it is possible to detect the current i more correctly with the preamp 16 and therefore the voltage V1 of the measured object 4 can be measured more correctly.

By constructing the driving circuit 14 using the transformer 14a, it is possible to easily supply (apply) the driving signal S2 to the capacitance changing structure 13 in a floating state using a highly versatile component (i.e., the transformer 14a). Also by increasing the turn ratio of the secondary winding 14c with respect to the primary winding 14b, it is possible to supply a driving signal S2 with a higher voltage to the capacitance changing structure 13. Since it is possible to increase the capacitance modulation range of the capacitance changing structure 13 (i.e., the range by which the electrostatic capacitance C1 varies), it is possible to measure the voltage V1 of the measured object 4 with high sensitivity.

According to the voltage measuring apparatus 1, by using a construction where the current detector 15 constructed of an impedance element is disposed in series with the variable capacitance circuit 19 between the detection electrode 12 and the case 11, and the control unit CNT causes the voltage generating circuit 25 to change the feedback voltage V4 (the voltage of the case 11) 50 that the voltage V2 generated when the current i flows through the current detector 15 decreases, it is possible to freely change the magnitude of the voltage V2 generated when the current i flows by changing the impedance of the impedance element. This means that the voltage V1 of the measured object 4 can be measured across a wide voltage range from a low voltage to a high voltage.

Note that the present invention is not limited to the construction described above. For example, although the feedback voltage V4 is controlled by P (Proportional) control in the voltage measuring apparatus 1 described above, by further adding at least one of an integral circuit and a differentiation circuit (neither is shown) to the feedback loop, it is also possible to control the feedback voltage V4 by one of PI (proportional-integral), PI (proportional-differential), or PID (proportional-integral-differential) control. Since it is possible to raise the ability to track the voltage V1 by using PID control, the voltage V1 of the measured object 4 can be measured with high precision when the voltage V1 changes.

Figure 8:
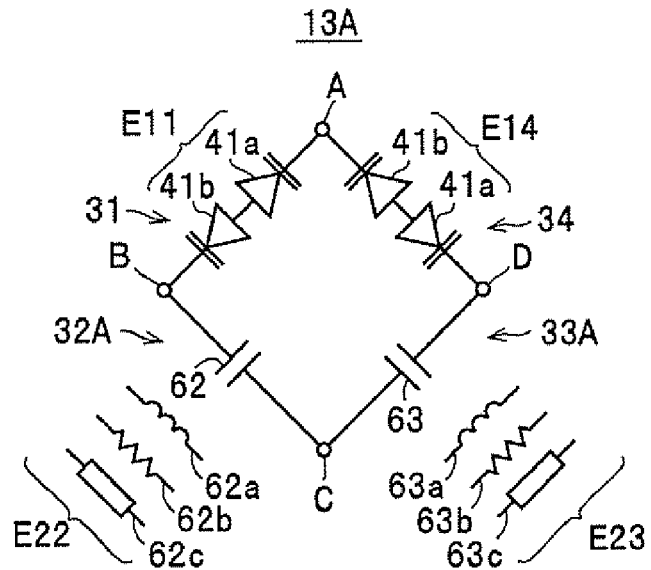
FIG. 8 is a circuit diagram of a capacitance changing structure used in a second variable capacitance circuit.

Also, although all of the construction units 31 to 34 in the capacitance changing structure 13 in the variable capacitance circuit 19 include the first electric elements E11 to E14, respectively, as shown in FIGS. 2 to 5, the present invention is not limited to this and the capacitance changing structure may be constructed by replacing the first electric elements included in each construction unit in one pair out of the pair of the first construction unit 31 and the fourth construction unit 34 and the pair of the second construction unit 32 and the third construction unit 33 out of the first to fourth construction units 31 to 34 in the capacitance changing structure 13 shown in FIGS. 2 to 5 with second electric elements that allow the transmission of AC signals. Here, the second electric elements are constructed so as to include at least one of a capacitor, a coil, a resistor, and a resonator. As one example, a capacitance changing structure 13A shown in FIG. 8 is constructed so as to include a second construction unit 32A and a third construction unit 33A constructed by respectively replacing the first electric elements E12, E13 of the second construction unit 32 and the third construction unit 33 of the capacitance changing structure 13 shown in FIG. 2 with second electric elements E22 and E23 (i.e., capacitors 62 and 63 with the same electrical characteristics). Note that in place of the capacitors 62 and 63, a pair of coils 62a and 63a with the same electrical characteristics (i.e., the same inductance) may be used, a pair of resistors 62b and 63b with the same electrical characteristics (i.e., the same resistance) may be used, or a pair of resonators 62c and 63c with the same electrical characteristics (i.e., the same frequency-impedance characteristics) may be used. Here, as the resonators 62c and 63c, resonators with electrical characteristics such that the impedance is minimized at the frequency f2 (i.e., the capacitance modulation frequency) that is double the frequency f1 of the driving signal S2 and the impedance is sufficiently high at other frequencies are used. More specifically, it is possible to use various types of resonators, such as ceramic resonators, crystal resonators, or an LC resonance circuit (a series resonance circuit) constructed of a coil and a capacitor. The resonators 62c and 63c may be constructed so as to permit the transmission of DC current.

Since the capacitance changing structure 13A also does not include a mechanically movable structure, it is possible to realize a variable capacitance circuit (a "second variable capacitance circuit" for the present invention) that is capable of capacitance changing operations at a high frequency and has high reliability. Also, in the same way as with the capacitance changing structure 13, since at least an adjacent pair of construction units in the capacitance changing structure 13A include the first electric elements E1, when the driving signal S2 is applied between the connection points B and D, the electrostatic capacitance C1 between the connection points A and C changes at the frequency f2 that is double the frequency f1 of the driving signal S2. This means that for a voltage measuring apparatus 1 (see FIG. 1) that uses the capacitance changing structure 13A, in the same way as the voltage measuring apparatus 1 described above, it is possible to sufficiently improve the reliability of the apparatus itself and to carry out control over the feedback voltage V4 at a high frequency of several hundred kHz to several MHz (i.e., it is possible to increase the operation frequency). As a result, it is possible to measure the voltage V1 of the measured object 4 in a short time. In the capacitance changing structure 13A also, the construction units 31 and 34 connected to the connection point A or the construction units 32 and 33 connected to the connection point C will include first electric elements (i.e., electric elements that always function as capacitors). This means it is possible to maintain a state where the detection electrode 12 and the case 11 are connected for alternating current via the variable capacitance circuit 19 without being short-circuited for direct current. Also, by using the resonators 62c and 63c with the electrical characteristics described above, it is possible to lower the impedances of the resonators 62c and 63c (that is, the construction units 32A and 33A that are constructed of the resonators 62c and 63c) at the capacitance modulation frequency (the frequency f2) of the capacitance changing structure 13A, and as a result, a sufficient alternating current (current i) can flow through the capacitance changing structure 13A. This means that it is possible to sufficiently increase the precision with which a voltage measuring apparatus 1 that uses the capacitance changing structure 13A detects the voltage.

Also, a capacitance changing structure may be constructed by replacing the first electric elements E1 included in each construction unit in one pair out of the pair of the first construction unit 31 and the second construction unit 32 and the pair of the third construction unit 33 and the fourth construction unit 34 out of the first to fourth construction units 31 to 34 in the capacitance changing structure 13 shown in FIGS. 2 to 5 with third electric elements that hinder the transmission of a DC signal and permit the transmission of an AC signal. In this case, each third electric element includes at least one of a capacitor and a resonator. As one example, the capacitance changing structure 13B shown in FIG. 9 includes the third construction unit 33B and the fourth construction unit 34A constructed by respectively replacing the first electric elements E13 and E14 of the third construction unit 33 and the fourth construction unit 34 in the capacitance changing structure 13 shown in FIG. 2 with third electric elements E33 and E34 (as one example, capacitors 63 and 64 with the same electrical characteristics). Note that in place of the capacitors 63 and 64, it is possible to use a pair of resonators 63d and 64a that have the same electrical characteristics (i.e., the same frequency-impedance characteristics). Here, as the resonators 63d and 64a, resonators with electrical characteristics such that the impedance is minimized at the frequency f2 (the capacitance modulation frequency) that is double the frequency f1 of the driving signal S2 and the impedance is sufficiently high at other frequencies are used. More specifically, it is possible to use various types of resonators, such as ceramic resonators, crystal resonators, or an LC resonance circuit (a series resonance circuit) constructed of a coil and a capacitor. The resonators 63d and 64a are constructed so as to hinder the transmission of DC current.

Since the capacitance changing structure 13B also does not include a mechanically movable structure, it is possible to realize a variable capacitance circuit (a "third variable capacitance circuit" for the present invention) that is capable of capacitance changing operations at a high frequency and has high reliability. Also, in the same way as with the capacitance changing structure 13, since at least an adjacent pair of construction units in the capacitance changing structure 13B include the first electric elements E1, when the driving signal S2 is applied between the connection points B and D, the electrostatic capacitance C1 between the connection points A and C changes at the frequency f2 that is double the frequency f1 of the driving signal S2. This means that for a voltage measuring apparatus 1 (see FIG. 1) that uses the capacitance changing structure 13B, in the same way as the voltage measuring apparatus 1 described above, it is possible to sufficiently improve the reliability of the apparatus itself and to carry out control over the feedback voltage V4 at a high frequency of several hundred kHz to several MHz (i.e., it is possible to increase the operation frequency). As a result it is possible to measure the voltage V1 of the measured object 4 in a short time. Also, in the capacitance changing structure 13B, one of the construction units 31 and 34 connected to the connection point A includes a first electric element (an electric element that always functions as a capacitor) and the other construction unit includes a capacitor or a resonator that functions so as to hinder the transmission of DC current. In the same way, one of the construction units 32 and 33 connected to the connection point C includes a first electric element (an electric element that always functions as a capacitor) and the other construction unit includes a capacitor or a resonator that functions so as to hinder the transmission of DC current. This means it is possible to maintain a state where the detection electrode 12 and the case 11 are connected for alternating current via the variable capacitance circuit 19 without being short-circuited for direct current. By using resonators 63d and 64a with the electrical characteristics described above, it is possible to lower the impedances of the resonators 63d and 64a (that is, the construction units 33B and 34A that are constructed of the resonators 63d and 64a) at the capacitance modulation frequency (the frequency f2) of the capacitance changing structure 13B, and as a result, a sufficient alternating current (current i) can flow through the capacitance changing structure 13B. This means that it is possible to sufficiently increase the precision with which a voltage measuring apparatus 1 that uses the capacitance changing structure 13B detects the voltage.

Figure 9:
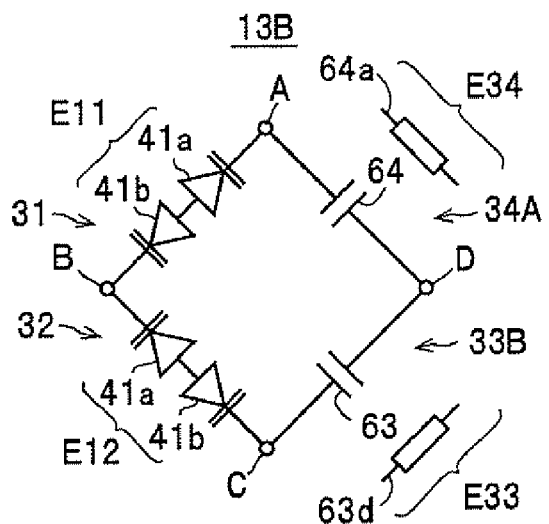
FIG. 9 is a circuit diagram of a capacitance changing structure used in a third variable capacitance circuit.

Note that the capacitance changing structures 13A and 13B shown in FIGS. 8 and 9 are not limited to the constructions described above and although not illustrated, as one example it is possible to use a construction where the first electric elements E11, E12, and E14 are constructed not of variable-capacitance diodes but of normal diodes (i.e., silicon diodes) or pairs of diodes (variable-capacitance diodes or silicon diodes) where the cathode terminals are connected together in series.

Figure 4:
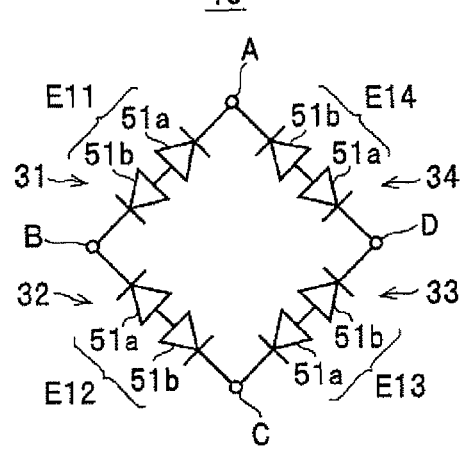
FIG. 4 is yet another circuit diagram of the capacitance changing structure used in the first variable capacitance circuit of the voltage measuring apparatus.
Figure 10:
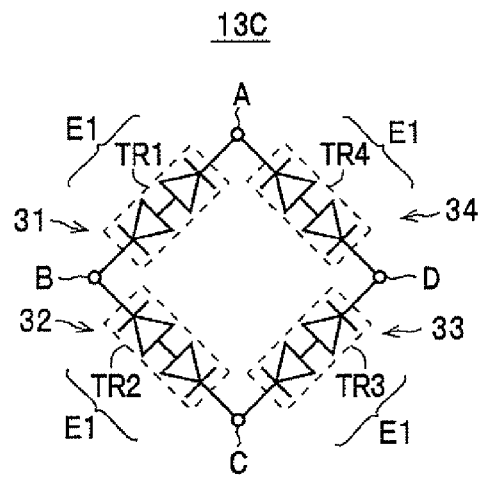
FIG. 10 is a circuit diagram of yet another capacitance changing structure.

In the capacitance changing structure 13 shown in FIG. 4, the construction units 31 to 34 are respectively constructed of pairs of first devices 51 (more specifically, normal diodes), and by connecting together the anode terminals of the pairs of diodes that construct the construction units 31 to 34, the diodes are connected in series with opposite orientations. That is, the construction units 31 to 34 are constructed so that P-type semiconductors and N-type semiconductors are disposed in an N-P-P-N arrangement. This means that by replacing the pairs of first devices 51 (diodes) that construct the construction units 31 to 34 in the capacitance changing structure 13 shown in FIG. 4 with single NPN-type bipolar transistors TR1 to TR4 so that the first electric elements E11 to E14 included in the construction units 31 to 34 are respectively constructed of single transistors, it is possible to construct a capacitance changing structure 13C shown in FIG. 10. In this capacitance changing structure 13C, the transistors TR1 to TR4 are disposed on a ring-shaped path constructed of the construction units 31 to 34 and the respective input terminals (one out of the collector terminal and the emitter terminal) and output terminals (the other out of the collector terminal and the emitter terminal) of the transistors TR1 to TR4 are connected (to form the respective connection points). Note that the control terminals (base terminals) of the transistors TR1 to TR4 are not connected (such terminals do not form connection points).

Figure 11:
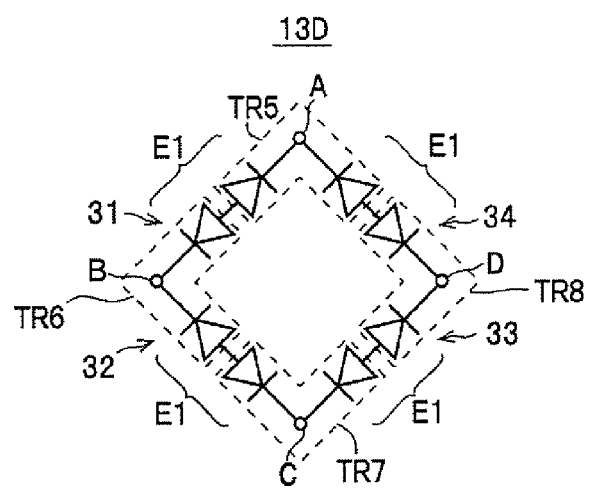
FIG. 11 is a circuit diagram of yet another capacitance changing structure.

In the capacitance changing structure 13 shown in FIG. 4, diodes in the first electric elements E1 of the construction units 31 and 34, the construction units 31 and 32, the construction units 32 and 33, and the construction units 33 and 34 are adjacent on both sides of the connection points A, B, C, and D (more specifically, such diodes are connected to each other in series with opposite orientations). In this way, for a capacitance changing structure 13 where the first electric elements E1 are constructed of pairs of diodes that are connected in series with opposite orientations and at least two adjacent construction units include such first electric elements E1, diodes in adjacent first electric elements E1 will be connected in series with opposite orientations with a connection point between two construction units in between. This means that in the capacitance changing structure 13, two P-type semiconductors and two N-type semiconductors that construct the diodes are disposed via a connection point in a P-N-N-P arrangement. More specifically, in the capacitance changing structure 13 shown in FIG. 4, in the pair of the first device 51b of the fourth construction unit 34 and the first device 51a of the first construction unit 31, the pair of the first device 51b of the first construction unit 31 and the first device 51a of the second construction unit 32, the pair of the first device 51b of the second construction unit 32 and the first device 51a of the third construction unit 33, and the pair of the first device 51b of the third construction unit 33 and the first device 51a of the fourth construction unit 34, the two diodes that construct the first devices 51a and 51b are connected in series with opposite orientations, and as a result the two P-type semiconductors and two N-type semiconductors on both sides of the connection points A, B, C, and D are disposed in a P-N-N-P arrangement. This means that by replacing such pairs of diodes with single PNP-type bipolar transistors TR5 to TR8, it is also possible to construct the capacitance changing structure 13D shown in FIG. 11. Here, the "first electric elements E1" are respectively constructed of part of one transistor and part of another transistor. In the capacitance changing structure 13D, in the same way as in the capacitance changing structure 13C, the transistors TR5 to TR8 are disposed on a ring-shaped path constructed of the construction units 31 to 34 and the respective input terminals (one out of the collector terminal and the emitter terminal) and output terminals (the other out of the collector terminal and the emitter terminal) of the transistors TR5 to TR8 are connected (to form the respective connection points). Note that unlike the capacitance changing structure 13C, the control terminals (base terminals) of the transistors TR5 to TRS are used as the connection points A, B, C, and D.

Figure 5:
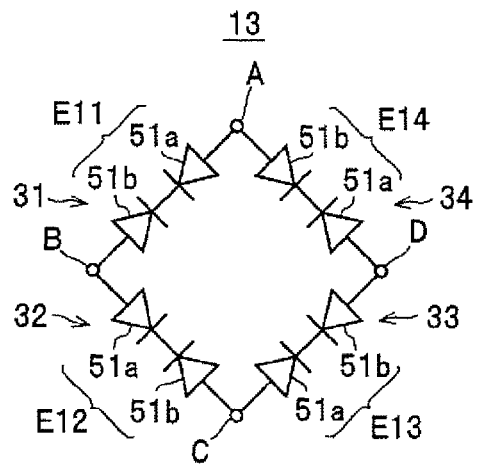
FIG. 5 is yet another circuit diagram of the capacitance changing structure used in the first variable capacitance circuit of the voltage measuring apparatus.
Figure 12:
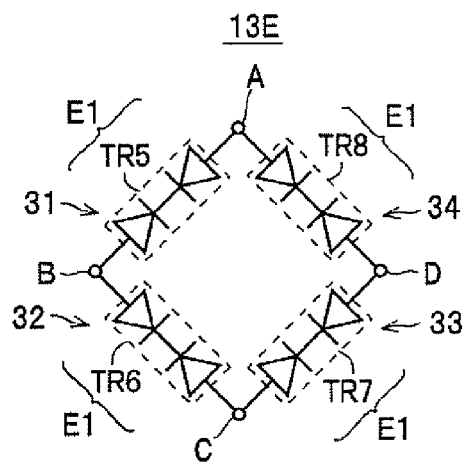
FIG. 12 is a circuit diagram of yet another capacitance changing structure.
Figure 13:
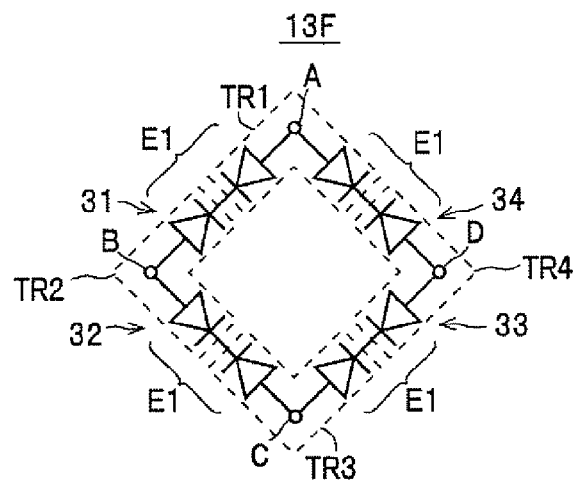
FIG. 13 is a circuit diagram of yet another capacitance changing structure.

In the capacitance changing structure 13 shown in FIG. 5 where the first electric elements E11 to E14 of the construction units 31 to 34 are constructed of pairs of diodes that are connected in series by connecting together the cathode terminals, in the same way as the capacitance changing structure 13 shown in FIG. 4, by replacing the pairs of diodes that construct the first electric elements E11 to E14 with PNP-type bipolar transistors TR5 to TR8, it is possible to construct the capacitance changing structure 13E shown in FIG. 12. Alternatively, by replacing the pairs of diodes described above (the four pairs respectively composed of pairs of adjacent diodes on both sides of the connection points A, B, C, and D) with NPN-type bipolar transistors TR1 to TR4, it is possible to construct the capacitance changing structure 13F shown in FIG. 13. Also, although an example where bipolar transistors are used as the transistors has been described, it should be obvious that it is possible to use MOSFET (magnetic field effect transistors) of the same type in place of the NPN-type bipolar transistors or to use MOSFET (metal oxide semiconductor field effect transistor) of the same type in place of the PNP-type bipolar transistors. In this case, one of the drain terminal and the source terminal is the input terminal of the MOSFET and the other of the drain terminal and the source terminal is the output terminal. With the constructions shown in FIGS. 11 and 13, the gate terminals that serve as control terminals are used as the connection points A, B, C, and D. In this way, by constructing the first electric elements E1 using the transistors TR1 to TR4 (or TR5 to TR8), it is possible to construct the capacitance changing structures 13C to 13F easily, at low cost, and with a lower number of components.

Figure 14:
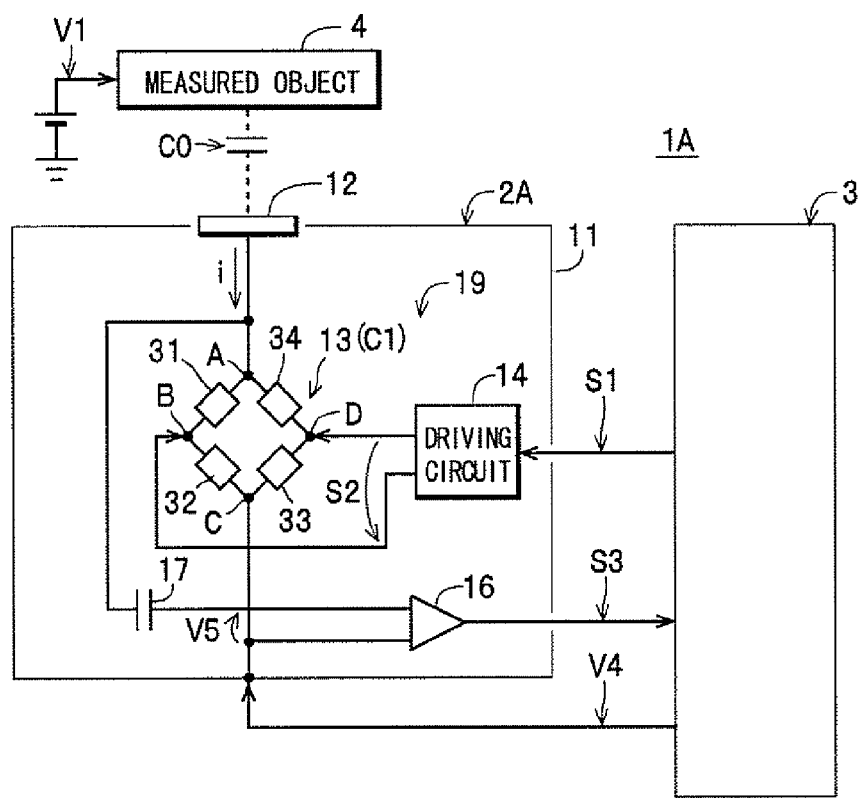
FIG. 14 is a block diagram of another voltage measuring apparatus.

Also, like the voltage measuring apparatus 1A shown in FIG. 14, it is possible to use a construction that uses an output probe unit 2A where no current detector 15 is provided and the voltage V5 across both ends of the capacitance changing structures 13, 13A, . . . , 13F (hereinafter collectively referred to as the capacitance changing structure 13 when no distinction is required) is detected by the preamp 16 and outputted as the detection signal S3 and the control unit CNT controls the voltage generating circuit 25 based on the detection signal S3 that changes in proportion to the voltage V5 across both ends to measure the voltage V1 of the measured object 4. Here, the expression "voltage V5 across both ends of the capacitance changing structure 13" refers to a voltage between the detection electrode 12 end of the capacitance changing structure 13 (the connection point A) and the case 11 end of the capacitance changing structure 13 (the connection point C). Here, as shown in FIG. 14, one input terminal out of the pair of input terminals of the preamp 16 is connected via a capacitor 17 to the detection electrode 12 end of the capacitance changing structure 13, and the other input terminal is connected to the case 11 end of the capacitance changing structure 13. Note that since the rest of the construction of the voltage measuring apparatus 1A is the same as that of the voltage measuring apparatus 1, component elements that are the same as the component elements of the voltage measuring apparatus 1 have been assigned the same reference numerals in FIG. 14 and duplicated description thereof has been omitted. In this voltage measuring apparatus 1A, by using the variable capacitance circuit 19 that includes the capacitance changing structure 13 described above, like the voltage measuring apparatus 1, the response speed of the feedback loop constructed of the current detector 15 to the voltage generating circuit 25 can be increased, and as a result, it is possible to measure the voltage V1 of the measured object 4 in a short time and to correctly measure the voltage V1 of the measured object 4 even when the voltage V1 changes over time or when the voltage V1 is an AC voltage that cyclically changes. Also, according to the voltage measuring apparatus 1A, by using the variable capacitance circuit 19 that is highly reliable, it is possible to significantly improve the reliability of the voltage measuring apparatus 1A itself.

Also, although the voltage measuring apparatuses 1 and 1A are constructed so that frequency components within a predetermined band including the frequency f2 are extracted from the detection signal S4 by the synchronous detection circuit 23, the present invention is not limited to this and although not illustrated it is possible to use a construction where a well-known envelope detection method is used in place of synchronous detection.

Figure 15:
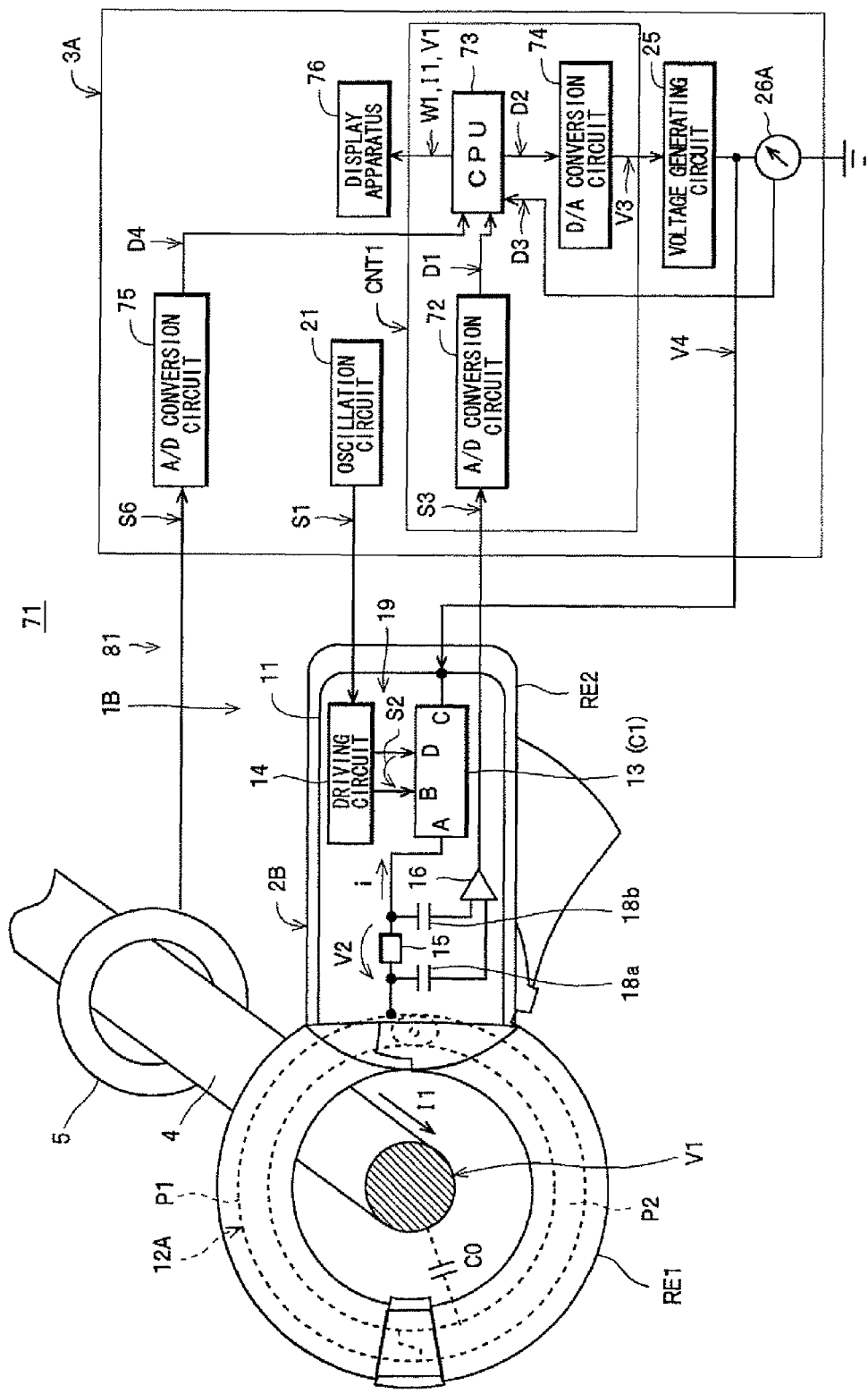
FIG. 15 is a block diagram of yet another voltage measuring apparatus and a power measuring apparatus that uses the same.

Also, although the current detector 15 is disposed between the variable capacitance circuit 19 and the case 11 in the voltage measuring apparatus 1, like the voltage measuring apparatus 1B shown in FIG. 15, it is possible to dispose the current detector 15 between a detection electrode 12A and the variable capacitance circuit 19. Also, although the voltage generating circuit 25 is subjected to analog feedback control using the filter circuit 27, the amplification circuit 22, the synchronous detection circuit 23, and the integrator 24 that operate using analog signals in the voltage measuring apparatus 1, like the voltage measuring apparatus 1B, the voltage generating circuit 25 may be subjected to digital feedback control by converting the detection signal S3 to digital data.

The voltage measuring apparatus 1B will now be described together with a power measuring apparatus 71 constructed using the voltage measuring apparatus 1B with reference to FIG. 15. Note that out of the component elements of the voltage measuring apparatus 1B, elements that are the same as the component elements of the voltage measuring apparatus 1 have been assigned the same reference numerals and description thereof has been omitted.

The power measuring apparatus 71 is constructed to measure DC and AC power and includes a clamp-type probe unit 2B for measuring voltage, a clamp-type probe unit 5 for measuring current, and a main unit 3A. In the power measuring apparatus 71, the voltage measuring apparatus 1B for measuring the voltage V1 of the measured object 4 (as one example, a wire and hereinafter also referred to as the "wire 4") is constructed of the probe unit 2B and component elements included in the main unit 3A that are described later. Also, a current measuring apparatus 81 for measuring a current I1 flowing through the wire 4 is constructed of the probe unit 5 and component elements included in the main unit 3A that are described later. The power measuring apparatus 71 measures the power W1 supplied to the wire 4 based on the voltage V1 measured by the voltage measuring apparatus 1B and the current I1 measured by the current measuring apparatus 81.

The voltage measuring apparatus 1B includes the probe unit 2B, and the oscillation circuit 21, an A/D conversion circuit 72, a CPU 73, a D/A conversion circuit 74, a voltage generating circuit 25, and a voltmeter 26A disposed inside the main unit 3A. The probe unit 2B includes the case 11, the detection electrode 12A, the variable capacitance circuit 19, the current detector 15, the preamp 16, and a pair of capacitors 18a and 18b. The detection electrode 12A is constructed of a pair of arc-shaped electrodes P1 and P2 that are entirely covered by an insulating film RE1 formed of a resin material or the like. One end of each of the arc-shaped electrodes P1, P2 is joined to the case 11 so that the arc-shaped electrodes P1, P2 are freely rotatable, and as a result, the other ends of the arc-shaped electrodes P1, P2 can be opened and closed. By using this construction, the detection electrode 12A can clamp the wire 4. The variable capacitance circuit 19, the current detector 15, the preamp 16, and the pair of capacitors 18a, 18b are disposed inside the case 11 that is covered by an insulating film RE2 formed of a resin material or the like. Also, the variable capacitance circuit 19 and the current detector 15 are disposed between the detection electrode 12A and the case 11 in a state where the variable capacitance circuit 19 and the current detector 15 are connected in series. In the voltage measuring apparatus 1B, unlike the voltage measuring apparatus 1, the current detector 15 is connected to the detection electrode 12A and the variable capacitance circuit 19 is connected to the case 11. To avoid having the detection electrode 12A connected in a DC circuit to the reference potential via the preamp 16 due to the current detector 15 being disposed on the detection electrode 12A side, the capacitors 18a and 18b used as a DC circuit breaker are disposed between the input terminals of the preamp 16 that detects the voltage V2 and the ends of the current detector 15. Note that in the same way as with the voltage measuring apparatus 1, it is also possible to connect the variable capacitance circuit 19 and the current detector 15 in the mentioned order in series between the detection electrode 12A and the case 11 and with this construction, it becomes unnecessary to dispose the capacitors 18a and 18b between the input terminals of the preamp 16 and the ends of the current detector 15.

Together with the CPU 73 and the D/A conversion circuit 74, the A/D conversion circuit 72 disposed inside the main unit 3A constructs a control unit CNT1 for the present invention, and converts the detection signal S3 as an analog signal to digital data D1 and outputs the digital data D1 to the CPU 73. The CPU 73 carries out a detection process (filtering process) that extracts, from the inputted digital data D1, data for components of the predetermined frequency band that includes the frequency f2 that is double the frequency f1 of the driving signal S1, for example, and carries out an integration process that integrates the data extracted by this detection process. The CPU 73 outputs the integrated data D2 obtained by the integration process to the D/A conversion circuit 74. As described later, the CPU 73 also functions as part of the current measuring apparatus 81 and based on digital data D4 outputted from an A/D conversion circuit 75 carries out a current calculating process that calculates (measures) the current I1 flowing through the measured object 4. In addition, based on the calculated value of the current I1 and the value (shown by digital data D3) of the feedback voltage V4 outputted from the voltmeter 26A, the CPU 73 carries out a power calculating process that calculates (measures) the power W1 supplied to the wire 4. The D/A conversion circuit 74 converts the integrated data D2 to the DC voltage V3 as an analog signal and outputs the DC voltage V3 to the voltage generating circuit 25. The voltmeter 26A measures and displays the feedback voltage V4 and converts the measured value of the feedback voltage V4 to the digital data D3 and outputs the digital data D3 to the CPU 73.

As shown in FIG. 15, the current measuring apparatus 81 includes the probe unit 5, and the A/D conversion circuit 75, the CPU 73, and a display apparatus 76 disposed inside the main unit 3A. Here, the probe unit 5 detects the value of the current I1 flowing through the clamped wire 4 without contacting the wire 4 and outputs a detection signal S6 whose amplitude changes in accordance with the detected value to the A/D conversion circuit 75. The A/D conversion circuit 75 converts the inputted detection signal S6 to the digital data D4 and outputs the digital data D4 to the CPU 73. By carrying out the current calculating process described above, the CPU 73 calculates the value of the current I1 based on the digital data D4 and has the value displayed by the display apparatus 76.

In the voltage measuring apparatus 1B of the power measuring apparatus 71 constructed in this way, the A/D conversion circuit 72, the CPU 73, and the D/A conversion circuit 74 that construct the control unit CNT1 convert the detection signal S3 to the digital data D1 and carry out digital feedback control of the voltage generating circuit 25 based on the digital data D1. Aside from this however, the voltage measuring apparatus 1B carries out feedback control of the voltage generating circuit 25 in the same way as the various component elements of the control unit CNT of the voltage measuring apparatus 1 to make the feedback voltage V4 match the voltage V1.

On the other hand, in the current measuring apparatus 81, the A/D conversion circuit 75 converts the detection signal S6 detected by the probe unit 5 to the digital data D4 and outputs the digital data D4 to the CPU 73 which then calculates the value of the current I1 flowing through the wire 4 by carrying out the current calculating process based on the digital data D4.

The CPU 73 also carries out the power calculating process based on the value of the feedback voltage V4 shown by the digital data D3 inputted from the voltmeter 26A (that is, the value of the voltage V1) and the value of the current I1 calculated by the current calculating process to calculate (measure) the power W1 supplied to the wire 4 and has the display apparatus 76 display the calculated value. By doing so, measurement of the power W1 is completed. Here, the CPU 73 has the display apparatus 76 display the value of the voltage V1 together with the power WI and the value of the current I1. Note that instead of having the display apparatus 76 display the current and voltage values, it is possible to use a construction where the current and voltage values are stored in a storage apparatus (not shown) and/or transferred outside the apparatus via a data transfer apparatus (not shown).

In this way, in the voltage measuring apparatus 1B, when measuring the voltage V1 of the wire 4 as the measured object 4, the detection signal S3 that shows the current i flowing through the variable capacitance circuit 19 is converted to the digital data D1 and digital feedback control is carried out over the voltage generating circuit 25 based on the digital data D1. Accordingly, the control unit CNT1 (the A/D conversion circuit 72, the CPU 73, and the D/A conversion circuit 74) can be easily constructed using a CPU or a DSP. In the voltage measuring apparatus 1B, the detection electrode 12A is constructed of a pair of arc-shaped electrodes P1 and P2 that are entirely covered by the insulating film RE1, and the variable capacitance circuit 19, the current detector 15, the preamp 16, and the pair of capacitors 18 and 18b are disposed inside the case 11 that is covered by the insulating film RE2. Since the detection electrode 12A, the variable capacitance circuit 19, the current detector 15, the preamp 16, and the pair of capacitors 18a and 18b are not exposed to the outside, it is possible to reliably avoid contact between such circuits and components and/or foreign matter outside the apparatus. The apparatus also uses the variable capacitance circuit 19 that does not include a mechanically movable structure and therefore has high reliability. Accordingly, it is possible to sufficiently improve the reliability of the voltage measuring apparatus 1B. By doing so, it is also possible to sufficiently improve the reliability of the power measuring apparatus 71 that uses the voltage measuring apparatus 1B.

Figure 16:
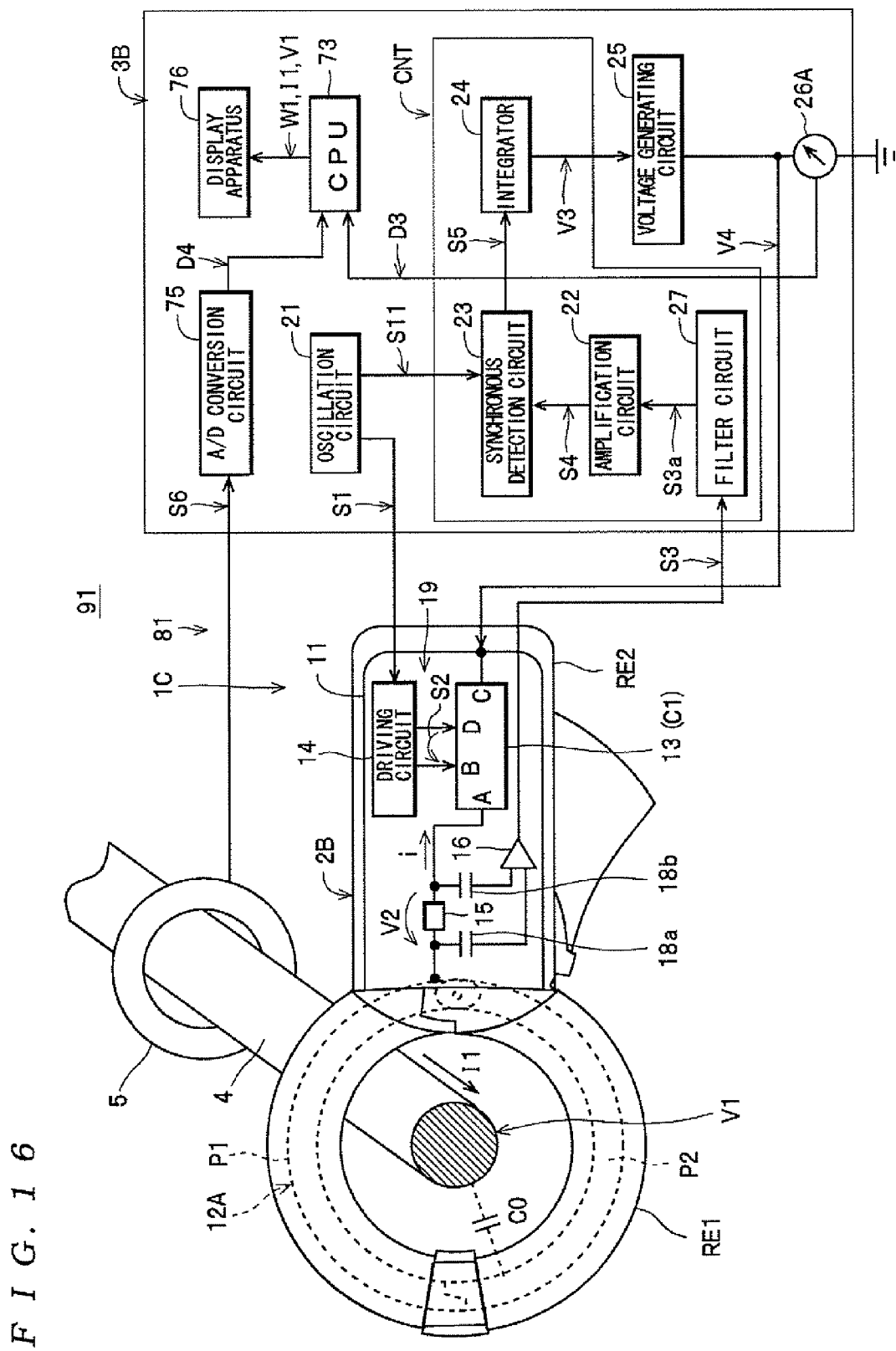
FIG. 16 is a block diagram of yet another voltage measuring apparatus and a power measuring apparatus that uses the same.

Also, although the power measuring apparatus 71 that uses a voltage measuring apparatus 1B for carrying out digital feedback control has been described, as shown in FIG. 16, it is possible to construct a power measuring apparatus 91 using a voltage measuring apparatus 1C that carries out analog feedback control. This power measuring apparatus 91 will now be described. Note that component elements that are the same as the voltage measuring apparatus 1 and component elements that are the same as the power measuring apparatus 71 have been assigned the same reference numerals and description thereof has been omitted.

The power measuring apparatus 91 is constructed so as to be capable of measuring DC and AC power and, as shown in FIG. 16, includes the probe units 2B, 5 and a main unit 3B. Here, in the power measuring apparatus 91, the voltage measuring apparatus 1C that measures the voltage V1 of the measured object 4 (as one example, the wire 4) is constructed of the probe unit 2B and the component elements described later that are included in the main unit 3B. In the same way, the current measuring apparatus 81 that measures the current I1 flowing through the wire 4 is constructed of the probe unit 5 and the component elements described later that are included in the main unit 3B. The power measuring apparatus 91 measures the power W1 supplied to the wire 4 based on the value of the voltage V1 measured by the voltage measuring apparatus 1C and the value of the current I1 measured by the current measuring apparatus 81.

The voltage measuring apparatus 1C includes the probe unit 2B and the oscillation circuit 21, the control unit CNT, the voltage generating circuit 25, and the voltmeter 26A disposed inside the main unit 3B. Here, the control unit CNT generates the DC voltage V3 based on the detection signal S3 as an analog signal and outputs the DC voltage V3 to the voltage generating circuit 25 so as to carry out analog feedback control over the feedback voltage V4 so as to make the feedback voltage V4 match the voltage V1. The current measuring apparatus 81 includes the probe unit 5 and the A/D conversion circuit 75, the CPU 73, and the display apparatus 76 disposed inside the main unit 3B. Here, the CPU 73 carries out a current calculating process to calculate the value of the current I1 based on the digital data D4 inputted from the A/D conversion circuit 75 and has the display apparatus 76 display the calculated value. The CPU 73 also calculates the value of the feedback voltage V4 (i.e., the voltage V1) based on the digital data D3 inputted from the voltmeter 26A and has the display apparatus 76 display the calculated value. In addition, the CPU 73 calculates (measures) the power W1 supplied to the wire 4 by carrying out a power calculating process based on the value of the feedback voltage V4 (that is, the value of the voltage V1) shown by the digital data D3 inputted from the voltmeter 26A and the value of the current I1 calculated by the current calculating process, and has the display apparatus 76 display the calculated value.

In the power measuring apparatus 91 also, by sufficiently improving the reliability of the voltage measuring apparatus 1C in the same way as the voltage measuring apparatus 1B, it is possible to sufficiently improve the reliability of the power measuring apparatus 91 itself that uses the voltage measuring apparatus 1C.

In the voltage measuring apparatuses 1, 1B, and 1C described above, the current detector 15 is constructed using a resistor, but the impedance element is not limited to a resistor and it is possible to use a capacitor or a coil, or a combination of the same. By using this type of impedance element, by changing the impedance of the impedance element, it is possible to freely change the voltage V2 generated when the current i flows. This means that it is possible to set the voltage V2 generated by the current detector 15 at an appropriate value in accordance with the magnitude of the voltage of the measured object 4 so that the voltage of the measured object 4 can be correctly measured across a wide voltage range from a low voltage to a high voltage.

Figure 17:
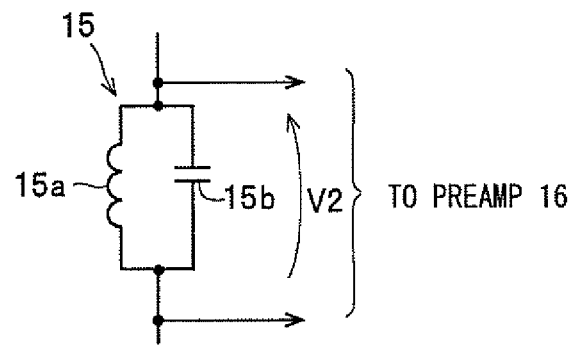
FIG. 17 is a circuit diagram showing an example construction of a current detector.

Also, in place of the impedance element, it is also possible to use a resonance circuit, which includes any of a variety of resonators such as a ceramic resonator or a crystal resonator, or an LC resonance circuit (a serial resonance circuit or a parallel resonance circuit) constructed of a coil and a capacitor. Out of such resonance circuits, an LC parallel resonance circuit and a resonance circuit that includes a resonator have a property whereby impedance is maximized at a specified frequency (the resonance frequency). This means that as shown in FIG. 17 for example, by constructing the current detector 15 using an LC parallel resonance circuit constructed of a coil 15a and a capacitor 15b and setting the specified frequency so as to match the capacitance modulation frequency of the capacitance changing structure 13, even it noise of a different frequency to the capacitance modulation frequency is superimposed on the current i, it will be possible to sufficiently increase, relative to voltage components due to the noise, the voltage component due to the current i out of the voltage components included in the voltage V2 generated across both ends of the current detector 15, thereby suppressing the noise.

Figure 18:
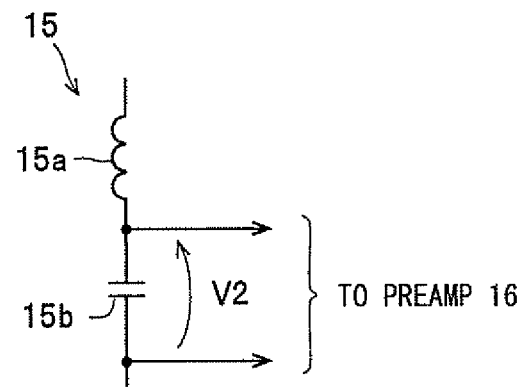
FIG. 18 is a circuit diagram showing another example construction of the current detector.

On the other hand, an LC series resonance circuit has a property whereby the overall impedance is minimized (i.e., becomes zero) at a specified frequency (the resonance frequency). At such time, the voltage across both ends of the capacitor (and also the coil) that constructs the LC series resonance circuit is maximized. This means that as shown in FIG. 18 for example, by constructing the current detector 15 using an LC series resonance circuit constructed of a coil 15a and a capacitor 15b, setting the specified frequency so as to match the capacitance modulation frequency, and using a construction where the preamp 16 detects the voltage across both ends of the capacitor 15b (or the coil 15a) as the voltage V2, even if noise of a different frequency to the capacitance modulation frequency is superimposed on the current i, it will be possible to suppress the generation of voltage due to noise generated across both ends of the current detector 15 in the same way as with the LC parallel resonance circuit described above. Accordingly, by constructing the current detector 15 of such resonance circuits and changing the impedance when the resonance circuit resonates, it is possible to freely change the voltage generated in the resonance circuit when the current i flows so that the voltage V1 of the measured object 4 can be measured across a wide voltage range from a low voltage to a high voltage. Also, since it is possible to detect the current i flowing in the resonance circuit as a larger voltage by changing the electrostatic capacitance C1 of the variable capacitance circuit 19 at the resonance frequency of the resonance circuit, it is possible to reduce the mixing of a voltage signal caused by such noise into the detection signal S3, and as a result, the voltage measuring apparatuses 1, 1B, and 1C can be made more resistant to noise. Accordingly, it is possible to measure the voltage V1 of the measured object 4 with reduced error.

Also, in place of a construction that detects the current by converting the current to a voltage using an impedance element, such as a resistor, or a resonance circuit, it is possible to use a construction that directly detects the current. As such construction, it is possible to use a current detector that uses electromagnetic induction (a CT current detector), or to use a magnetic sensor such as a Hall element, a magnetic bridge, a flux gate sensor, an MI (magnetic impedance) sensor, an MR (magnetoresistive effect) sensor, a GMR (giant magnetoresistive effect) sensor, or a TMR (tunneling magnetoresistive effect) sensor.

Also, although an example where the detection signal S3 generated by the preamp 16 is directly inputted into the A/D conversion circuit 72 has been described in the voltage measuring apparatus 1B, it is also possible to input the detection signal S3 into the A/D conversion circuit 72 via a filter circuit (not shown) with the same characteristics as the filter circuit 27. In this case, a filter circuit is disposed in at least one of the probe unit 2B and the main unit 3A. By using this construction, even if noise of a different frequency to the capacitance modulation frequency is superimposed on the current i, it is possible to suppress the mixing of such noise into the detection signal S3. As a result, the voltage measuring apparatus 1B can be made more resistant to noise. Also, the voltage measuring apparatus 1, 1A, and 1C may be constructed so that the filter circuit 27 is disposed inside the probe unit 2 instead of being disposed inside the main unit 3.

Although examples where the voltage measuring apparatuses 1B and 1C are used in the power measuring apparatuses 71, 91 have been described, the voltage measuring apparatuses 1, 1A, 1B, and 1C can be used as a surface potentiometer that detects the surface potential of a photosensitive drum in a copier such as a laser printer. It is also possible to use the voltage measuring apparatuses 1, 1A, 1B, and 1C as detectors that detect the position of electric wiring installed inside a wall. By using the voltage measuring apparatus according to the present invention in such appliances, it is possible to sufficiently improve the reliability (including the durability and weather resistance) of such appliances. The present invention can also be applied to a testing apparatus that detects broken wires and the like in a printed pattern formed on a printed circuit board.

Also, although the voltage measuring apparatuses 1, 1A, 1B, and 1C measure the voltage V1 of the measured object 4 with high precision by using a construction where the feedback voltage V4 is measured as the voltage V1 at a point when the feedback voltage V4 has reached the voltage V1 that is, a point where the current i has become zero amps or when the voltage V5 across both ends of the capacitance changing structure 13 has become zero volts, so long as the measurement precision is tolerated, it is also possible to use a construction where the feedback voltage V4 is measured as the voltage V1 of the measured object 4 at a point where the current i or the voltage V5 across both ends of the capacitance changing structure 13 is at or below a predetermined value (for example, several milliamps or several millivolts). It is also possible to use a construction where the feedback voltage V4 is measured as the voltage VI of the measured object 4 when the potential difference (V1−V4) has reached or is below a predetermined value (for example, several hundred millivolts). By using this construction, it is possible to measure the voltage V1 of the measured object 4 with tolerable precision in a shorter time.

Also, although examples have been described where, as shown in FIGS. 2 to 5 and FIGS. 8 to 13, the construction units of the capacitance changing structures 13 are constructed of one of the first electric elements E1 (as one example, two diodes that are connected in series with opposite orientations (the equivalent of two diodes in FIGS. 10 to 13)), the second electric elements E22 and E23, and the third electric elements E33 and E34, the present invention is not limited to such. For example, if construction units that include the first electric elements are described with the first construction unit 31 shown in FIG. 2 as a representative example, it is possible to construct the first construction unit 31 so as to include one first electric element E11 together with a construction element aside from the first electric element E11. More specifically, it is possible to also dispose at least one of a resistor, a capacitor, a coil, and another diode at at least one of a position between the connection point A and the first device 41a and a position between the connection point B and the first device 41b. It is also possible to construct the first electric elements E1 so as to include construction elements aside from the first devices 41a and 41b. More specifically, it is also possible to construct the first electric elements E1 by disposing at least one of a resistor, a capacitor, and a coil between the first devices 41a and 41b. Also, each of the first devices 41a and 41b or at least one out of the first devices 41a and 41b can also be connected in parallel to a capacitor.

In the same way, if construction units that include the second electric elements E22 (or E23) are described with a construction unit 32A shown in FIG. 8 as a representative example, it is possible to dispose at least one of a resistor, a capacitor, and a coil at at least one of a position between the connection point B and the second electric element E22 and a position between the connection point C and the second electric element E22. It is also possible to connect a capacitor in parallel to the second electric element E22. Also, if the construction units that include the third electric elements E33 (or E34) are described with the construction unit 33B shown in FIG. 9 as a representative example, it is possible to dispose at least one of a resistor, a capacitor, and a coil at at least one of a position between the connection point C and the third electric element E33 and a position between the connection point D and the third electric element E33. It is also possible to connect a separate capacitor in parallel to the third electric element E33.

Since variable-capacitance diodes have fundamentally the same construction as normal diodes, in the capacitance changing structure 13 shown in FIG. 2, for example, it is also possible to use a construction including a mixture of variable-capacitance diodes and normal diodes, such as a construction where a normal diode is used for one out of the variable-capacitance diodes used as the first devices 41a, 41b that construct the first electric elements E1. However, since the electrostatic capacitance differs for variable-capacitance diodes and normal diodes when a reverse bias is applied, it is preferable to use a construction where the balanced condition for a bridge circuit is satisfied and the construction units 31 and 32 and the construction units 34 and 33 disposed on both sides of the connection points A and C exhibit line symmetry or the construction units 31 and 34 and the construction units 32 and 33 disposed on both sides of the connection points B and D exhibit line symmetry.

Also, although in the examples described above, the connected state of the diodes (the variable-capacitance diodes, normal diodes, or diodes that are equivalently present within transistors) that serve as the pair of first devices that construct the electric elements is the same for all of the electric elements that construct the capacitance changing structures with either the anode terminals connected together in every electric element or the cathode terminals connected together in every electric element, it is also possible to construct the capacitance changing structure so as to include both electric elements where the anode terminals are connected together (the connected state shown in FIG. 2, hereinafter also referred to as the "first connected state") and electric elements where the cathode terminals are connected together (the connected state shown in FIG. 3, hereinafter also referred to as the "second connected state").

While the electrostatic capacitance Cl of the capacitance changing structures 13, 13A, 13C, and 13E is being changed by applying the driving signal S2 to the connection points B and D, one first device out of the pair of first devices (diodes) that construct an electric element repeatedly cycles between a state where the first device functions equivalently as a resistor and a state where the first device functions equivalently as a capacitor and the other first device functions in the opposite manner (i.e., as a capacitor when the other first device is a resistor and as a resistor when the other first device is a capacitor). In view of this, the connected states of the construction units that each include a pair of first devices should preferably be determined at one of the first connected state and the second connected state.

More specifically, with a construction where all of the construction units include a pair of first devices, when one out of anode terminals (first ends) and cathode terminals (other ends) of the two first devices included in the first construction unit and the second construction unit are connected together, the other out of anode terminals (first ends) and cathode terminals (other ends) of the two first devices included in the third construction unit and the fourth construction unit should preferably be connected together. That is, when the first construction unit and the second construction unit are in the first connected state, the third construction unit and the fourth construction unit should preferably be in the second connected state and conversely when the first construction unit and the second construction unit are in the second connected state, the third construction unit and the fourth construction unit should preferably be in the first connected state.

Figure 19:
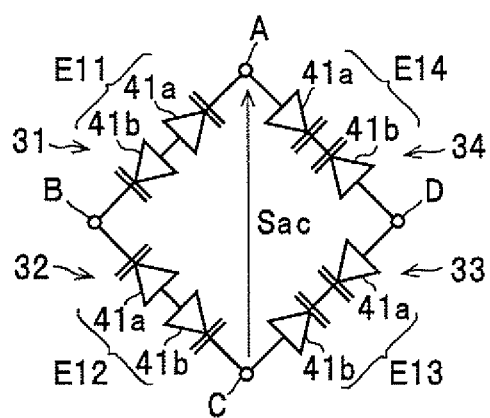
FIG. 19 is a circuit diagram of yet another capacitance changing structure.

More specifically, when all of the construction units E11 to E14 include a pair of first devices 41a, 41b as in the capacitance changing structures 13 shown in FIGS. 2 and 3, when the first construction unit E11 and the second construction unit E12 are in the first connected state (a state where the anode terminals are connected together), the third construction unit E13 and the fourth construction unit E14 are set in the second connected state (a state where the cathode terminals are connected together) as in the capacitance changing structure 13G shown in FIG. 19 for example. Also, although not illustrated, when the first construction unit E11 and the second construction unit E12 are in the second connected state, the third construction unit E13 and the fourth construction unit E14 are set in the first connected state.

Also with a construction where all of the construction units include a pair of first devices, it is possible to connect together one out of anode terminals (first ends) and cathode terminals (other ends) of the two first devices included in the first construction unit and the third construction unit and to connect together the other out of anode terminals (first ends) and cathode terminals (other ends) of the two first devices included in the second construction unit and the fourth construction unit. That is, when the first construction unit and the third construction unit are in the first connected state, the second construction unit and the fourth construction unit can be set in the second connected state and conversely when the first construction unit and the third construction unit are in the second connected state, the second construction unit and the fourth construction unit can be set in the first connected state.

Figure 20:
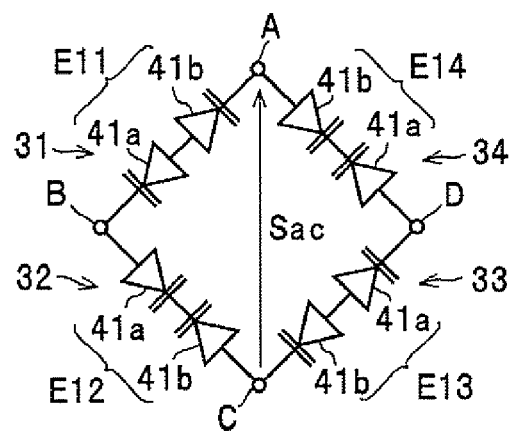
FIG. 20 is a circuit diagram of yet another capacitance changing structure.

More specifically, when all of the construction units E11 to E14 include pairs of first devices 41a, 41b as in the capacitance changing structures 13 shown in FIGS. 2 and 3, when the first construction unit E11 and the third construction unit E13 are in the first connected state (the state where the anode terminals are connected together), the second construction unit E12 and the fourth construction unit E14 are set in the second connected state (the state where the cathode terminals are connected together) as in the capacitance changing structure 13H shown in FIG. 20 for example. Also, although not illustrated, when the first construction unit E11 and the third construction unit E13 are in the second connected state, the second construction unit E12 and the fourth construction unit E14 are set in the first connected state.

Also with a construction where construction units in one pair of construction units out of a pair of the first construction unit and the fourth construction unit and a pair of the second construction unit and the third construction unit each include a pair of first devices, it is preferable to connect together one out of anode terminals (first ends) and cathode terminals (other ends) of the two first devices included in one of such construction units in the pair and to connect together the other out of anode terminals (first ends) and cathode terminals (other ends) of the two first devices included in the other construction unit.

Figure 21:
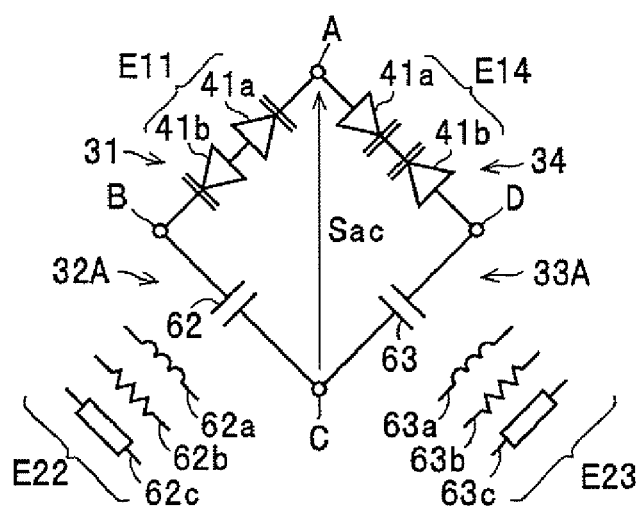
FIG. 21 is a circuit diagram of yet another capacitance changing structure.

More specifically, when the first construction unit E11 and the fourth construction unit E14 include pairs of first devices 41a, 41b as in the capacitance changing structure 13A shown in FIG. 8, when the first construction unit E11 is set in the first connected state (the state where the anode terminals are connected together), the fourth construction unit E14 is set in the second connected state (the state where the cathode terminals are connected together) as in the capacitance changing structure 13J shown in FIG. 21 for example. Also, although not shown, when the first construction unit E11 is set in the second connected state, the fourth construction unit E14 is set in the first connected state.

In the same way, although not shown, as the opposite to the capacitance changing structure 13A shown in FIG. 8, when a capacitance changing structure is constructed so that the second construction unit E12 and the third construction unit E13 include pairs of first devices 41a, 41b, and the first construction unit E11 and the fourth construction unit E14 include second electric elements E22 and E23 (for example, the capacitors 62 and 63 with the same electrical characteristics), the second construction unit E12 can be set in the first connected state and the third construction unit E13 in the second connected state. Similarly, the second construction unit E12 can be set in the second connected state and the third construction unit E13 in the first connected state.

As described above, when the capacitance changing structure is constructed so as to include both electric elements in the first connected state and electric elements in the second connected state, by using either of the constructions described above, since it is possible to dispose the first devices 41 that function as capacitors in the capacitance changing structure during a capacitor changing operation at positions that exhibit left-right symmetry (line symmetry) about a pair of opposing connection points A and C, it is possible to significantly reduce the potential difference between the connection points A and C. This makes it more preferable to use either of the constructions described above.

Figure 22:
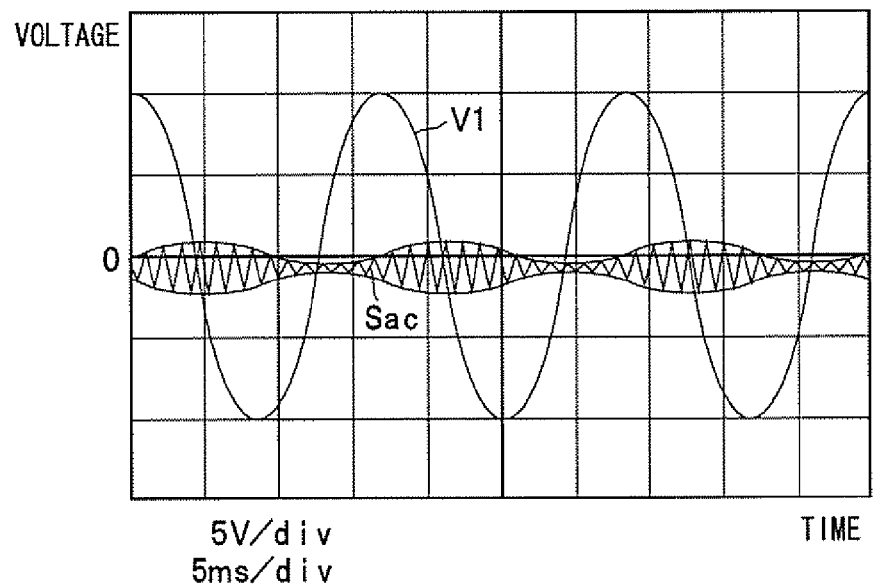
FIG. 22 is a waveform diagram of the voltage of a measured object and a signal in the voltage measuring apparatus that uses a capacitance changing structure.
Figure 23:
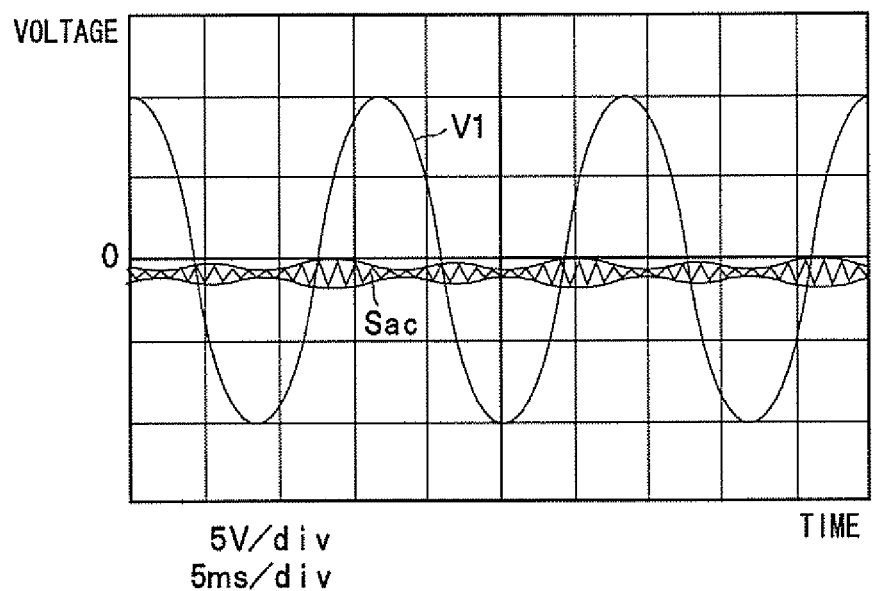
FIG. 23 is a waveform diagram of the voltage of the measured object and a signal in the voltage measuring apparatus that uses a capacitance changing structure.

The present invention will be described next with reference to an experimental sample. Varactor diodes ("BB147" made by Philips) were used as the first devices. A sine wave voltage signal with a frequency of 2.25 MHz and an amplitude of 16V was used as the driving signal S2. According to this experiment, when measuring the voltage V1 of the measured object 4 that changes with a commercial frequency as shown in FIGS. 22 and 23 using the voltage measuring apparatus 1 shown in FIG. 1, as shown in FIG. 22 although the amplitude of the signal Sac generated between the connection points A and C (a signal with the same frequency as the capacitance modulation frequency) was 3.2V when the capacitance changing structure 13 shown in FIG. 2 was used as the capacitance changing structure, as shown in FIG. 23 the amplitude of the signal Sac generated between the connection points A and C can be reduced to around half (i.e., around 1.7V) when the capacitance changing structure 13G shown in FIG. 19 was used as the capacitance changing structure. Note that the capacitance modulation frequency is extremely high compared to the commercial frequency. For this reason, the signal Sac is schematically shown in FIGS. 22 and 23. In FIGS. 22 and 23, for ease of understanding the changes in the amplitude of the signal Sac, the signal Sac is shown together with the signal envelope.

Although an example where the preamp 16 is constructed so as to include an insulating electronic component, such as a transformer or a photocoupler, and a differential operational amplifier has been described above, as shown in FIGS. 24 to 28, by including an insulating electronic component such as a transformer or a photocoupler (in the illustrated examples, a transformer 61) in the current detector 15, it is possible to easily construct the circuits on the secondary side of the insulating electronic component that are not directly connected to the capacitance changing structure 13 as circuits that use ground potential (base potential) as a reference. Accordingly, it is also possible to construct the preamp 16 of a single-ended operational amplifier. Since single-ended operational amplifiers are inexpensive compared to differential operational amplifiers, by using this construction, it is possible to reduce the cost of the entire apparatus. Also, by using an insulating electronic component such as the transformer 61, it is possible to electrically insulate the voltage V2 inputted into the preamp 16 from the current i and it is possible to freely set the level of the voltage V2. This means that even if the voltage V1 of the measured object 4 to be measured is an extremely high voltage, it will be easy to make the signal level of the voltage V2 conform to the input specification of the preamp 16.

Figure 24:
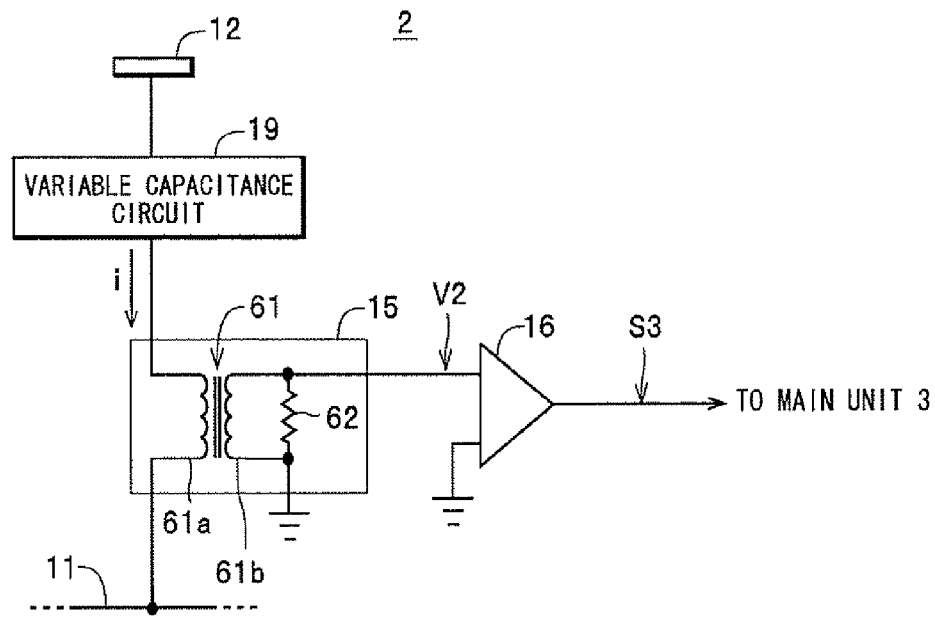
FIG. 24 is a circuit diagram showing other example constructions of the current detector and a preamp.

The construction shown in FIG. 24 is described first. In this construction, the current detector 15 includes the transformer 61 and a resistor 62. In this case, one end of the primary winding 61a of the transformer 61 is connected to the connection point C of the variable capacitance circuit 19 and the other end is connected to the case 11, so that the primary winding 61a is disposed between the detection electrode 12 and the case 11 (the reference potential) in a state where the primary winding 61a is connected in series to the variable capacitance circuit 19. Also, one end of the secondary winding 61b of the transformer 61 is connected to the input terminal of the preamp 16 and the other end is connected to ground potential. The secondary winding 61b also has the resistor 62 connected thereto in parallel. With this construction, the current detector 15 detects the current i flowing in the variable capacitance circuit 19 and the voltage V2 that is proportional to the current i is generated across the resistor 62. Also, by inputting and amplifying the voltage V2 as a signal that has ground potential as a reference, the preamp 16 converts the voltage V2 to the detection signal S3 and outputs the detection signal S3.

Figure 25:
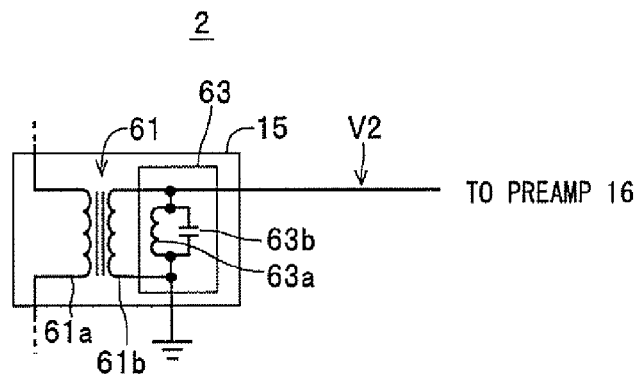
FIG. 25 is a circuit diagram showing yet another example construction of the current detector.

The construction shown in FIG. 25 is described next. Note that component elements that are the same as in the construction shown in FIG. 24 have been assigned the same reference numerals and duplicated description thereof has been omitted. In this construction, in place of the resistor 62 in the construction shown in FIG. 24, a parallel resonance circuit 63 constructed of a coil 63a and a capacitor 63b is connected in parallel to the secondary winding 61b. According to this construction, in the same way as the construction shown in FIG. 17 described above, by setting the resonance frequency of the parallel resonance circuit 63 so as to match the capacitance modulation frequency of the capacitance changing structure 13, even if noise of a different frequency to the capacitance modulation frequency is superimposed on the current i, it will be possible to suppress such noise and to sufficiently increase, relative to voltage components due to the noise, the voltage component due to the current i out of the voltage components included in the voltage V2 generated across both ends of the current detector 15 (i.e., it is possible to raise the S/N ratio). Accordingly, by using this construction, it is possible to omit the filter circuit 27 from the main unit 3.

Figure 26:
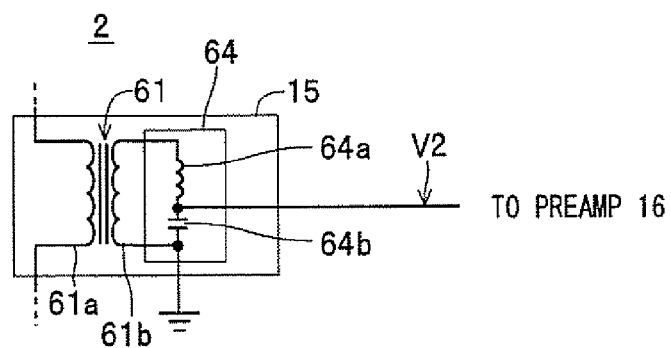
FIG. 26 is a circuit diagram showing yet another example construction of the current detector.
Figure 27:
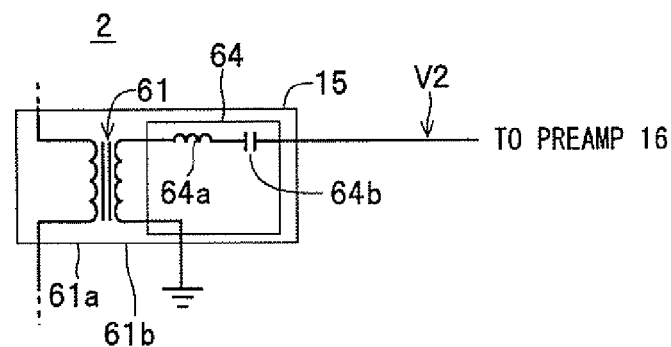
FIG. 27 is a circuit diagram showing yet another example construction of the current detector.
Figure 28:
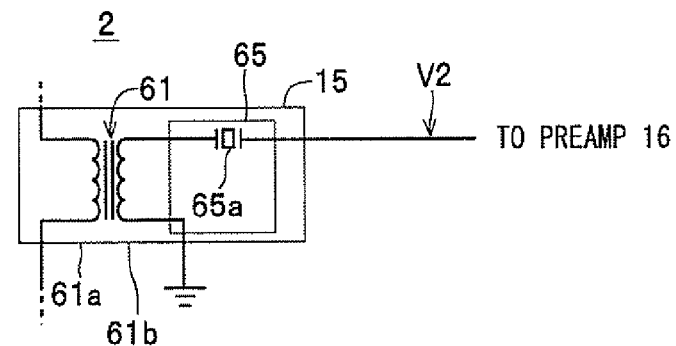
FIG. 28 is a circuit diagram showing yet another example construction of the current detector.

The construction shown in FIG. 26 is described next. Note that component elements that are the same as in the construction shown in FIG. 24 have been assigned the same reference numerals and duplicated description thereof has been omitted. In this construction, in place of the resistor 62 in the construction shown in FIG. 24, a series resonance circuit 64 constructed of a coil 64a and a capacitor 64b is connected in parallel to the secondary winding 61b. Also, in the preamp 16, the voltage generated at the connection point of the coil 64a and the capacitor 64b is outputted as the voltage V2. According to this construction, in the same way as with the construction shown in FIG. 18 described above, by setting the resonance frequency of the series resonance circuit 64 so as to match the capacitance modulation frequency, even if noise of a different frequency to the capacitance modulation frequency is superimposed on the current i, it will be possible to suppress the generation of voltage due to such noise across both ends of the current detector 15 in the same way as with the LC parallel resonance circuit described above. Also, as shown in FIG. 27, it is possible to use a construction where the series resonance circuit 64 constructed of the coil 64a and the capacitor 64b is connected between one end of the secondary winding 61b and the input terminal of the preamp 16 and the other end of the secondary winding 61b is connected to ground potential. With this construction also, the same effect can be achieved as with the current detector 15 shown in FIG. 26.

Also, although a so-called LC resonance circuit constructed of a coil and a capacitor is used in the constructions shown in FIGS. 25 to 27, it is also possible to use a resonator such as a crystal resonator or a ceramic resonator in place of the LC resonance circuit. As one example, the current detector 15 shown in FIG. 28 includes a resonance circuit 65 constructed using a resonator 65a in place of the coil 64a and the capacitor 64b of the current detector 15 shown in FIG. 27. In the current detector 15 shown in FIG. 28, since the resonator 65 is connected in series to the secondary winding 61b in the same way as in the current detectors 15 shown in FIGS. 26 and 27, the same effect as the current detectors 15 shown in FIGS. 26 and 27 can be achieved.

Also although a construction has been described above that includes the synchronous detection circuit 23 that detects the detection signal S4 in synchronization with the wave detection signal S11 to generate the pulse signal S5 whose amplitude changes in proportion to the value of the current i flowing in the variable capacitance circuit 19 and whose polarity changes in accordance with the direction of the current i flowing in the variable capacitance circuit 19 and the integrator 24, it is also possible to realize a voltage measuring apparatus using another construction. For example, it is possible to use a construction where the synchronous detection circuit 23 is replaced with a detection circuit that detects the detection signal S4 using an envelope detection method, for example, to generate an analog signal (the DC voltage V3) whose amplitude (voltage) changes in proportion to the amplitude (magnitude) of the current i. By using this construction, it becomes unnecessary to provide the integrator 24. It is also possible to use a construction where the capacitance changing structure 13 (or 13A to 13H or 13J) described above is converted to an integrated circuit and incorporated in a package.

What is claimed is:

1. A voltage measuring apparatus that measures the voltage of a measured object, comprising:
    a detection electrode capable of being disposed facing the measured object; and
    a variable capacitance circuit comprising a capacitance changing structure constructed by connecting a first construction unit, a second construction unit, a third construction unit, and a fourth construction unit, which each include a first electric element that hinders transmission of a direct current (DC) signal and has a capacitance that changes in accordance with the magnitude of an absolute value of an applied voltage, in the mentioned order in a ring;
    a driving circuit that changes the electrostatic capacitance of the capacitance changing structure by applying an AC voltage between a connection point of the first construction unit and the second construction unit and a connection point of the third construction unit and the fourth construction unit;
    wherein the variable capacitance circuit is connected between the detection electrode and a reference potential so that a connection point of the first construction unit and the fourth construction unit is positioned on a detection electrode side of the variable capacitance circuit and a connection point of the second construction unit and the third construction unit is positioned on a reference potential side of the variable capacitance circuit.

2. A variable capacitance circuit according to claim 1, wherein each first electric element is constructed by connecting two first devices, which each function as a resistor when the potential of a first end is higher than the other end and function as a capacitor when the potential of the first end of the first device is lower than the other end, in series with opposite orientations.

3. A variable capacitance circuit according to claim 1, wherein each first electric element is constructed by connecting two first devices, which each function as a resistor when the potential of a first end is higher than the other end and function as a capacitor when the potential of the first end of the first device is lower than the other end, in series with opposite orientations,
    one out of both first ends and both other ends of the two first devices included in the first construction unit and the second construction unit are connected together, and
    the other out of both first ends and both other ends of the two first devices included in the third construction unit and the fourth construction unit are connected together.

4. A variable capacitance circuit according to claim 1, wherein each first electric element is constructed by connecting two first devices, which each function as a resistor when the potential of a first end is higher than the other end and function as a capacitor when the potential of the first end of the first device is lower than the other end, in series with opposite orientations,
    one out of both first ends and both other ends of the two first devices included in the first construction unit and the third construction unit are connected together, and
    the other out of both first ends and both other ends of the two first devices included in the second construction unit and the fourth construction unit are connected together.

5. A variable capacitance circuit according to claim 2, wherein each first device includes a P-type semiconductor and an N-type semiconductor that are joined together.

6. A variable capacitance circuit according to claim 3, wherein each first device includes a P-type semiconductor and an N-type semiconductor that are joined together.

7. A variable capacitance circuit according to claim 4, wherein each first device includes a P-type semiconductor and an N-type semiconductor that are joined together.

8. A variable capacitance circuit according to claim 5, wherein each first device is composed of a diode formed of the P-type semiconductor and the N-type semiconductor.

9. A variable capacitance circuit according to claim 6, wherein each first device is composed of a diode formed of the P-type semiconductor and the N-type semiconductor.

10. A variable capacitance circuit according to claim 7, wherein each first device is composed of a diode formed of the P-type semiconductor and the N-type semiconductor.

11. A variable capacitance circuit according to claim 5, wherein the P-type semiconductors and the N-type semiconductors included in the two first devices that are connected in series with opposite orientations are constructed of a single transistor that is disposed in a ring-shaped circuit composed of the four construction units with an input terminal and an output terminal of the transistor as connection points.

12. A variable capacitance circuit according to claim 6, wherein the P-type semiconductors and the N-type semiconductors included in the two first devices that are connected in series with opposite orientations are constructed of a single transistor that is disposed in a ring-shaped circuit composed of the four construction units with an input terminal and an output terminal of the transistor as connection points.

13. A variable capacitance circuit according to claim 7, wherein the P-type semiconductors and the N-type semiconductors included in the two first devices that are connected in series with opposite orientations are constructed of a single transistor that is disposed in a ring-shaped circuit composed of the four construction units with an input terminal and an output terminal of the transistor as connection points.

14. A variable capacitance circuit according to claim 5, wherein out of the first devices included in two adjacent construction elements out of the construction elements that include the first electric elements, the P-type semiconductors and the N-type semiconductors included in two first devices out of the first devices that have opposite orientations and are adjacent on both sides of a connection point between the two construction units are constructed of a single transistor.

15. A variable capacitance circuit according to claim 6, wherein out of the first devices included in two adjacent construction elements out of the construction elements that include the first electric elements, the P-type semiconductors and the N-type semiconductors included in two first devices out of the first devices that have opposite orientations and are adjacent on both sides of a connection point between the two construction units are constructed of a single transistor.

16. A variable capacitance circuit according to claim 7, wherein out of the first devices included in two adjacent construction elements out of the construction elements that include the first electric elements, the P-type semiconductors and the N-type semiconductors included in two first devices out of the first devices that have opposite orientations and are adjacent on both sides of a connection point between the two construction units are constructed of a single transistor.

17. A variable capacitance circuit according to claim 1, wherein a product of impedances of the first construction unit and the third construction unit is set equal to or substantially equal to a product of impedances of the second construction unit and the fourth construction unit.

18. A variable capacitance circuit according to claim 1, wherein the driving circuit includes a transformer that generates the AC voltage in a secondary winding thereof.

19. A voltage measuring apparatus according to claim 1, further comprising a voltage generating circuit that generates the reference potential and a control unit,
wherein the control unit causes the voltage generating circuit to change the voltage of the reference potential while the electrostatic capacitance of the variable capacitance circuit is changing.

20. A voltage measuring apparatus according to claim 19, wherein while the electrostatic capacitance is changing, the control unit causes the voltage generating circuit to change the voltage of the reference potential so that one of a current flowing via the variable capacitance circuit between the detection electrode and the reference potential and a voltage generated between a detection electrode end and a reference potential end of the variable capacitance circuit decreases.

21. A voltage measuring apparatus according to claim 20, further comprising an impedance element disposed in series with the variable capacitance circuit between the detection electrode and the reference potential,
wherein the control unit causes the voltage generating circuit to change the voltage of the reference potential so that a voltage generated in the impedance element when the current flows through the impedance element decreases.

22. A voltage measuring apparatus according to claim 20, further comprising a resonance circuit disposed in series with the variable capacitance circuit between the detection electrode and the reference potential,
wherein the control unit causes the voltage generating circuit to change the voltage of the reference potential so that a voltage generated in the resonance circuit when the current flows through the resonance circuit decreases.

23. A voltage measuring apparatus according to claim 20, further comprising a transformer including a primary winding disposed in series with the variable capacitance circuit between the detection electrode and the reference potential and a secondary winding that is magnetically coupled to the primary winding,
wherein the control unit causes the voltage generating circuit to change the voltage of the reference potential so that a voltage generated in the secondary winding decreases.

24. A voltage measuring apparatus according to claim 20, wherein the control unit includes an A/D conversion circuit that receives an input of a detection signal whose voltage changes in accordance with a value of the current or a value of the voltage generated between the detection electrode end and the reference potential end and converts the detection signal to digital data, and
the control unit causes the voltage generating circuit to change the voltage of the reference potential based on the digital data so that the voltage of the detection signal decreases.

25. A power measuring apparatus comprising:
a current measuring apparatus that measures current flowing through a measured object; and
a voltage measuring apparatus according claim 1 that measures the voltage of the measured object,
wherein the power measuring apparatus measures power based on the current measured by the current measuring apparatus and the voltage measured by the voltage measuring apparatus.

* * * * *